US008337219B2

(12) United States Patent
Green et al.

(10) Patent No.: US 8,337,219 B2
(45) Date of Patent: Dec. 25, 2012

(54) CARD GUIDE GROUNDING STRIPS

(75) Inventors: Daniel C. Green, Kunkletown, PA (US); James E. Kline, Blairstown, NJ (US)

(73) Assignee: Laird Technologies, Inc., Earth City, MO (US)

(*) Notice: Subject to any disclaimer, the term of this patent is extended or adjusted under 35 U.S.C. 154(b) by 186 days.

(21) Appl. No.: 13/031,193

(22) Filed: Feb. 19, 2011

(65) Prior Publication Data

US 2012/0214362 A1 Aug. 23, 2012

(51) Int. Cl.
*H01R 4/66* (2006.01)
(52) U.S. Cl. .......................................... 439/92; 439/907
(58) Field of Classification Search .................. 439/92, 439/907, 857
See application file for complete search history.

(56) References Cited

U.S. PATENT DOCUMENTS

| | | | |
|---|---|---|---|
| 4,740,136 A | 4/1988 | Asai et al. | |
| 5,015,802 A * | 5/1991 | Chi | 174/354 |
| 5,250,751 A | 10/1993 | Yamaguchi | |
| 5,398,154 A | 3/1995 | Perkins et al. | |
| 5,490,043 A | 2/1996 | Tan et al. | |
| 5,532,428 A | 7/1996 | Radloff et al. | |
| 5,563,450 A * | 10/1996 | Bader et al. | 257/785 |
| 5,762,754 A | 6/1998 | Kondo et al. | |
| 5,920,460 A | 7/1999 | Olendorf et al. | |
| 6,008,994 A | 12/1999 | Bates | |
| 6,049,464 A | 4/2000 | Garbelli et al. | |
| 6,051,781 A | 4/2000 | Bianca et al. | |
| 6,174,171 B1 | 1/2001 | Fu | |
| 6,267,629 B1 | 7/2001 | Nguyen et al. | |
| 6,320,120 B1 | 11/2001 | Van Haaster | |
| 2004/0266232 A1 * | 12/2004 | Mangold | 439/92 |
| 2008/0113532 A1 * | 5/2008 | Smeltz | 439/92 |

FOREIGN PATENT DOCUMENTS

| | | |
|---|---|---|
| DE | 10103619 | 8/2001 |
| DE | 10038162 | 10/2001 |
| EP | 0222656 | 5/1987 |
| EP | 0563629 | 10/1993 |
| EP | 0678830 | 5/1995 |
| EP | 0675538 | 10/1995 |

(Continued)

OTHER PUBLICATIONS http://www.itw-fastex.com/electronics-fasteners.html, accessed Jul. 21, 2011, 2 pages.

(Continued)

*Primary Examiner* — Tulsidas C Patel
*Assistant Examiner* — Travis Chambers
(74) *Attorney, Agent, or Firm* — Harness, Dickey & Pierce, P.L.C.

(57) ABSTRACT

A grounding strip is described configured to be installed along an edge portion of a substrate for establishing electrical grounding contact between the substrates and a card guide. The grounding strip includes integral grounding members. Each grounding member includes opposing sidewall portions defining a channel configured to receive the edge portion of the substrate therein. The sidewall portions of each grounding member are configured to engage the substrate when the edge portion of the substrate is received in the channel to help retain the edge portion of the substrate in the channel. Each grounding member also includes a contact element disposed generally over the channel. The contact element is integrally formed with at least one of the opposing sidewall portions of the grounding member and is configured to establish electrical contact with the card guide when the grounding strip is installed to the substrate and located in the card guide.

19 Claims, 22 Drawing Sheets

FOREIGN PATENT DOCUMENTS

| | | |
|---|---|---|
| EP | 0717467 | 6/1996 |
| GB | 2257839 | 1/1993 |
| JP | 06-310881 | 11/1994 |
| JP | 2000-085837 | 3/2000 |
| JP | 2002-057495 | 2/2002 |
| WO | WO 98/24154 | 6/1998 |
| WO | WO 03/030609 | 4/2003 |
| WO | WO 2008/063747 | 5/2008 |

OTHER PUBLICATIONS http://www.epak.com/c4470/c4479/c4482/default.html, accessed Jul. 21, 2011, 2 pages.

Office Action issued by the United States Patent and Trademark Office dated Sep. 16, 2008, for U.S. Appl. No. 11/640,508, which shares the same assignee, Laird Technologies, Inc., as the instant application, 12 pages.

International Search Report and Written Opinion dated Jul. 30, 2012 for International patent application No. PCT/US2011/065688. International patent application No. PCT/US2011/065688 claims priority to the instant application; 13 pages.

Laird Technologies Online Catalog for Card Guide Clip-On Gasket; 9 pages; 2011.

\* cited by examiner

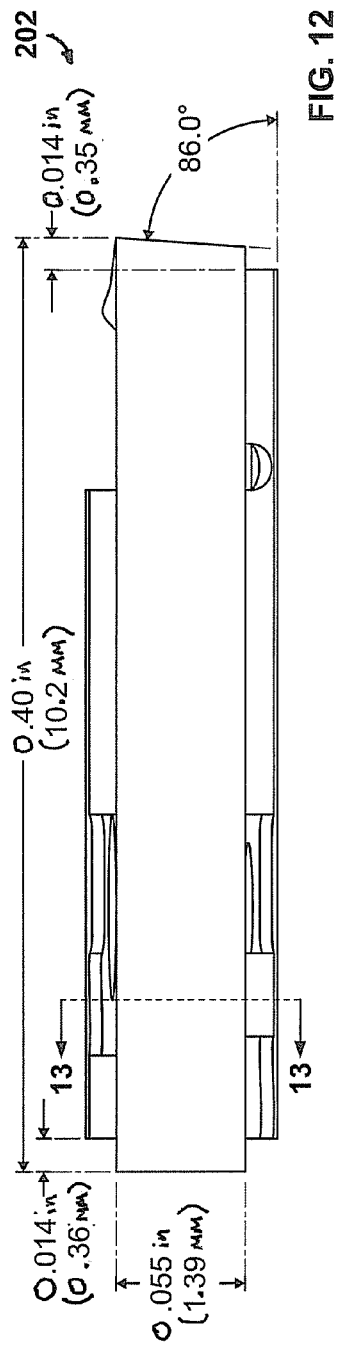
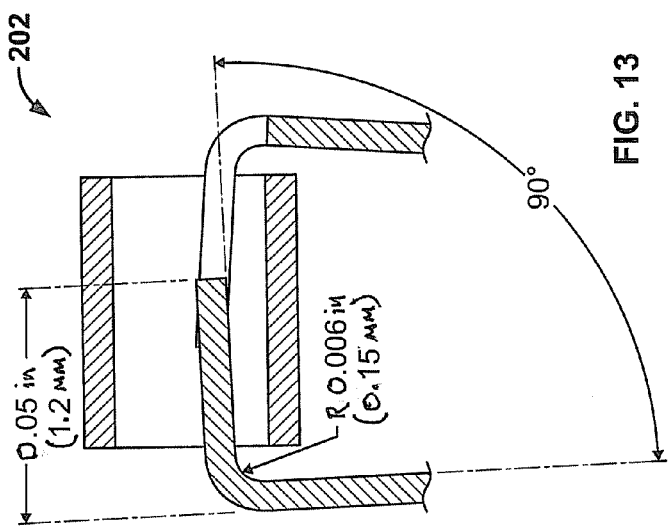
FIG. 12
FIG. 13

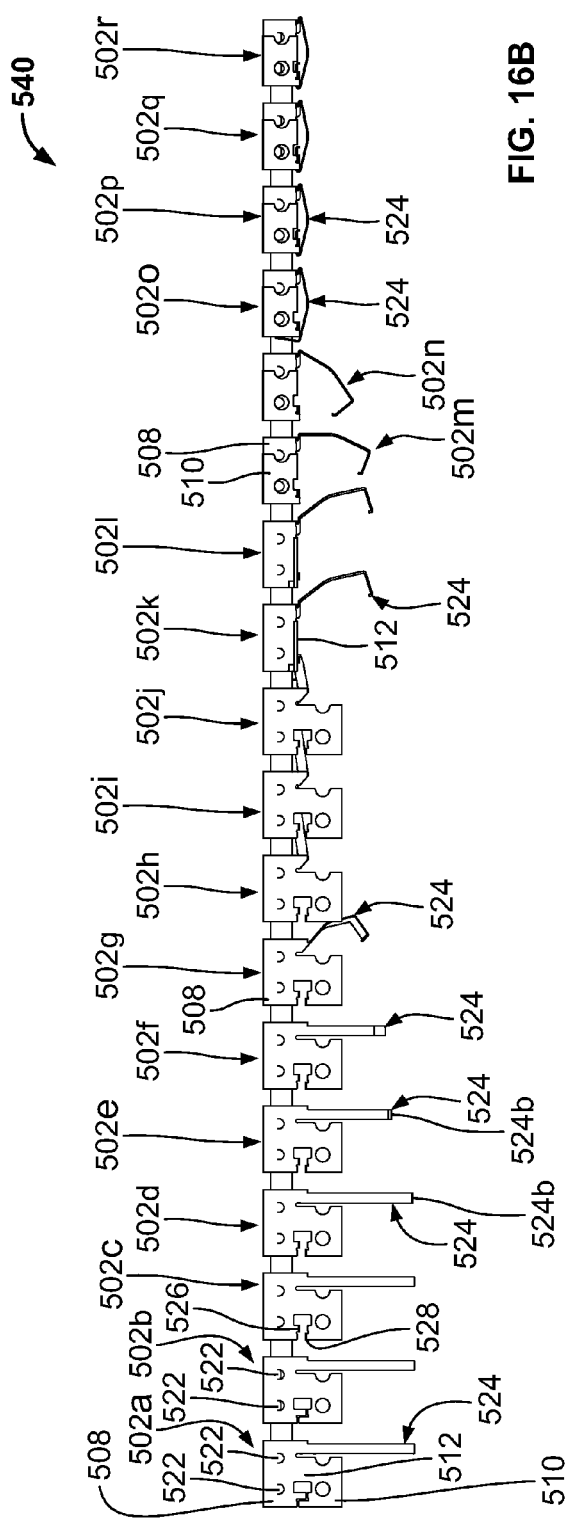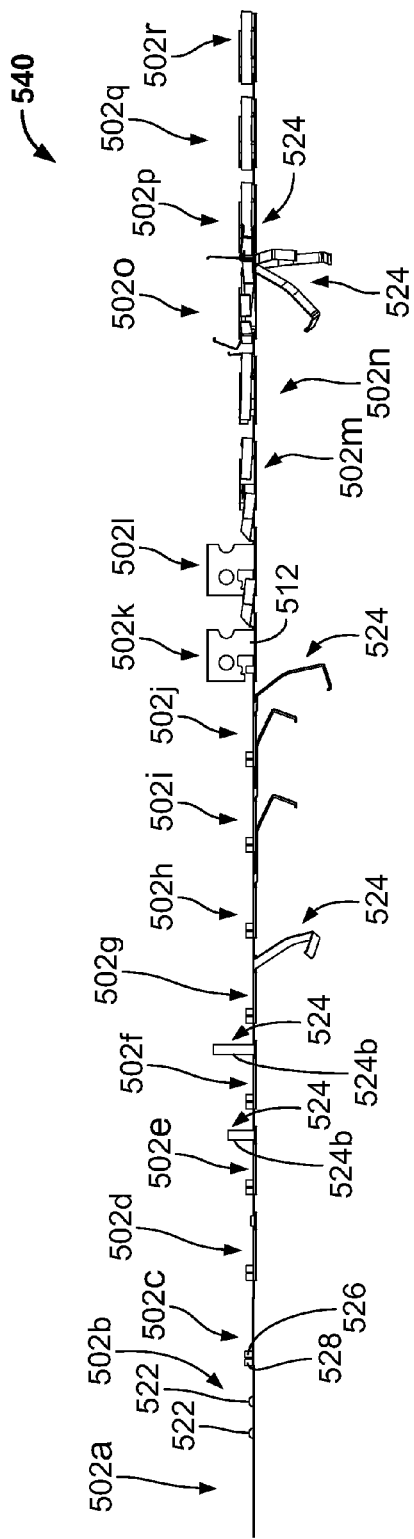

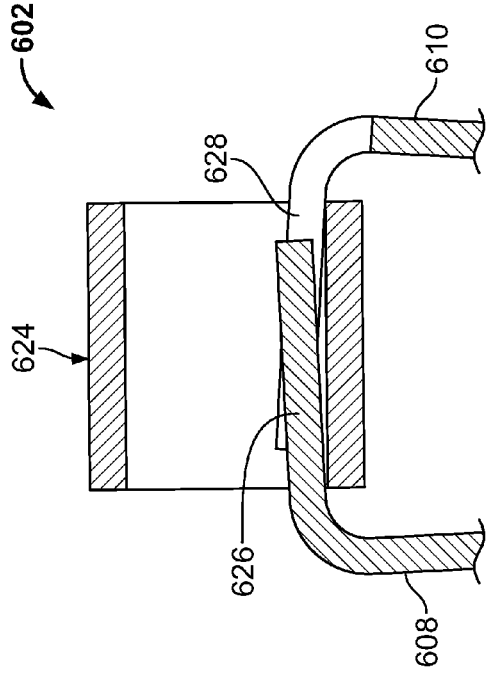
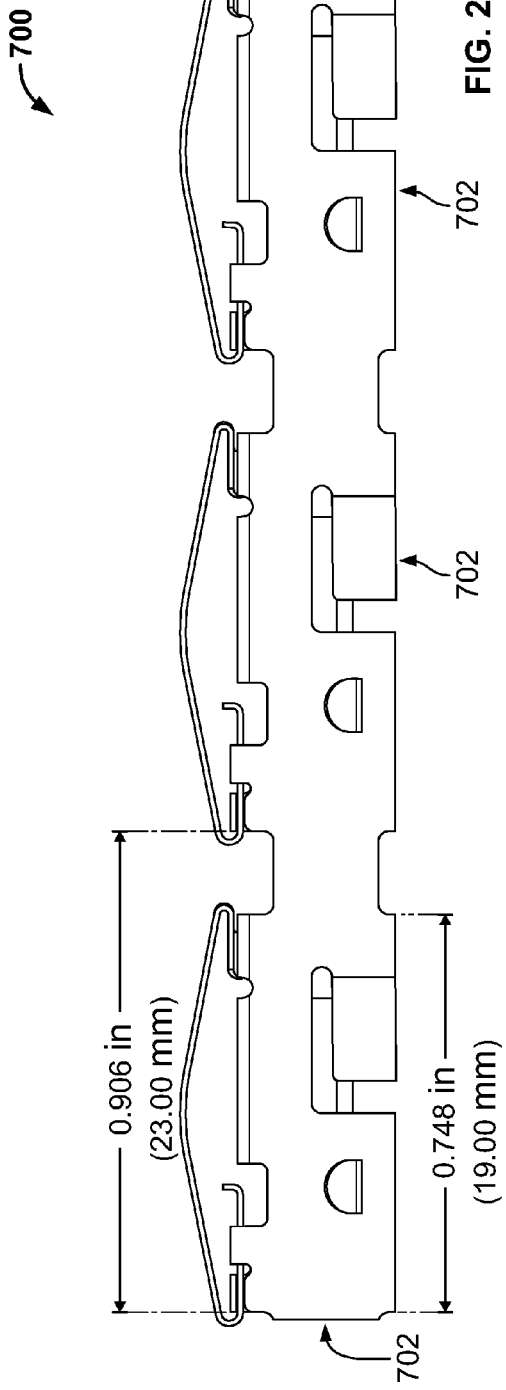

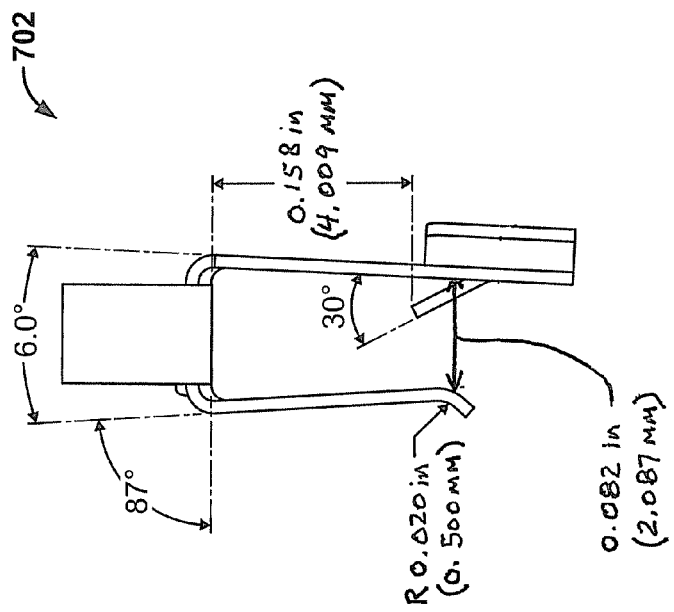
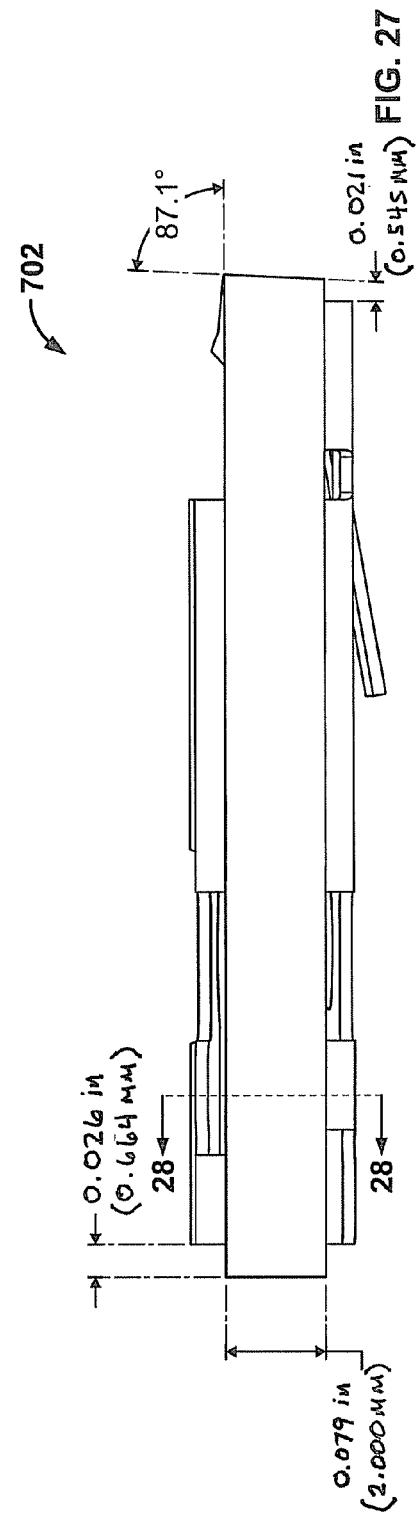
FIG. 26
FIG. 27

CARD GUIDE GROUNDING STRIPS

FIELD

The present disclosure relates to card guide grounding strips that include grounding members, which strips may be clipped or placed onto edge portions of substrates for establishing electrical grounding contact from electrically-conductive portions of the substrates to adjacent card guides.

BACKGROUND

This section provides background information related to the present disclosure which is not necessarily prior art.

Electronic cards are commonly used, for example, when adding capacity and/or functionality to personal computers. Standards for such cards have been established (type I, type II, and type III cards) by the Personal Computer Memory Card International Association (PCMCIA). A PCMCIA card is a credit card-size memory or input/output device that connects to a personal computer, usually a notebook or laptop computer. Structurally, electronic cards usually include one or more printed circuit boards interposed between shields that provide rigidity sufficient to exceed applicable bending and torsional resistance specifications.

Electronic cards and other substrates, such as printed circuit boards, are commonly mounted within personal computers, chasses, and rack systems by way of card guides. By way of example, the card guides allow for relatively easy installation by sliding the substrate's edges along the channels, grooves, slots, etc. defined by the card guides. During this sliding installation procedure, the card guides help guide the electronic cards or printed circuit board (as the case may be) into their operational, installed positions. The card guides may also help hold the electronic cards or printed circuit boards relatively securely in place and inhibit flexing and bending thereof. Card guides usually allow for relatively easy removal of installed electronic cards or printed circuit boards, for example, when repairs and/or replacements are needed.

Electronic cards and circuit boards usually include electrical components that radiate electromagnetic waves, which may cause noise or unwanted signals to appear in electrical devices existing within a certain proximity of the radiating electrical components. Accordingly, it is not uncommon to provide grounding for circuitry that emits or is susceptible to electromagnetic radiation, to thereby allow offending electrical charges and fields to be dissipated without disrupting operation.

SUMMARY

This section provides a general summary of the disclosure, and is not a comprehensive disclosure of its full scope or all of its features.

Example embodiments of the present disclosure are generally directed toward grounding members configured to be installed to edge portions of substrates for establishing electrical grounding contact between the substrates and card guides. In one example embodiment, a grounding member includes opposing sidewall portions defining a channel configured to receive an edge portion of a substrate therein. The sidewall portions are configured to engage the substrate when the edge portion of the substrate is received in the channel to help retain the edge portion of the substrate in the channel. The grounding member also includes a contact element disposed generally over the channel. The contact element is configured to establish electrical contact with at least a portion of a card guide when the grounding strip is installed to a substrate and located in the card guide, and the contact element is integrally formed with at least one of the opposing sidewall portions.

Example embodiments of the present disclosure are generally directed toward grounding strips configured to be installed along edge portions of substrates for establishing electrical grounding contact from the substrates to card guides. In one example embodiment, a grounding strip includes at least two grounding members each having an integral construction, and wherein the at least two grounding members are integrally formed with each other from a single piece of material.

Example embodiments of the present disclosure are also generally directed toward methods of making grounding members configured to be installed to edge portions of substrates for establishing electrical grounding contact from the substrates to card guides. In one example embodiment, such an method includes forming a desired shape for the grounding member from a flat piece of material, and folding the flat piece of material so as to define opposing sidewall portions, a channel disposed generally between the opposing sidewall portions, and a contact element disposed generally over the channel for the grounding member. The contact element is integrally formed with at least one of the opposing sidewall portions, and is configured to establish electrical contact with at least a portion of a card guide when the grounding strip is installed to a substrate and located in the card guide.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 12 is a top plan view of the grounding member of FIG. 10;

FIG. 13 is a section view of the grounding member of FIG. 12 taken in a plane including line 13-13 in FIG. 12;

FIG. 16B is a top plan view of FIG. 16A;

FIG. 16C is a side elevation view of FIG. 16A;

FIG. 23 is a section view of the grounding member of FIG. 22 taken in a plane including line 23-23 in FIG. 22;

FIG. 24 is a front elevation view of a grounding strip according to another example embodiment of the present disclosure, and including three grounding members and providing example dimensions in inches (with millimeters in brackets) and degrees for various features of the grounding strip (for purposes of illustration only);

FIG. 26 is an end elevation view of the grounding member of FIG. 25;

FIG. 27 is a top plan view of the grounding member of FIG. 25;

Figure 28:
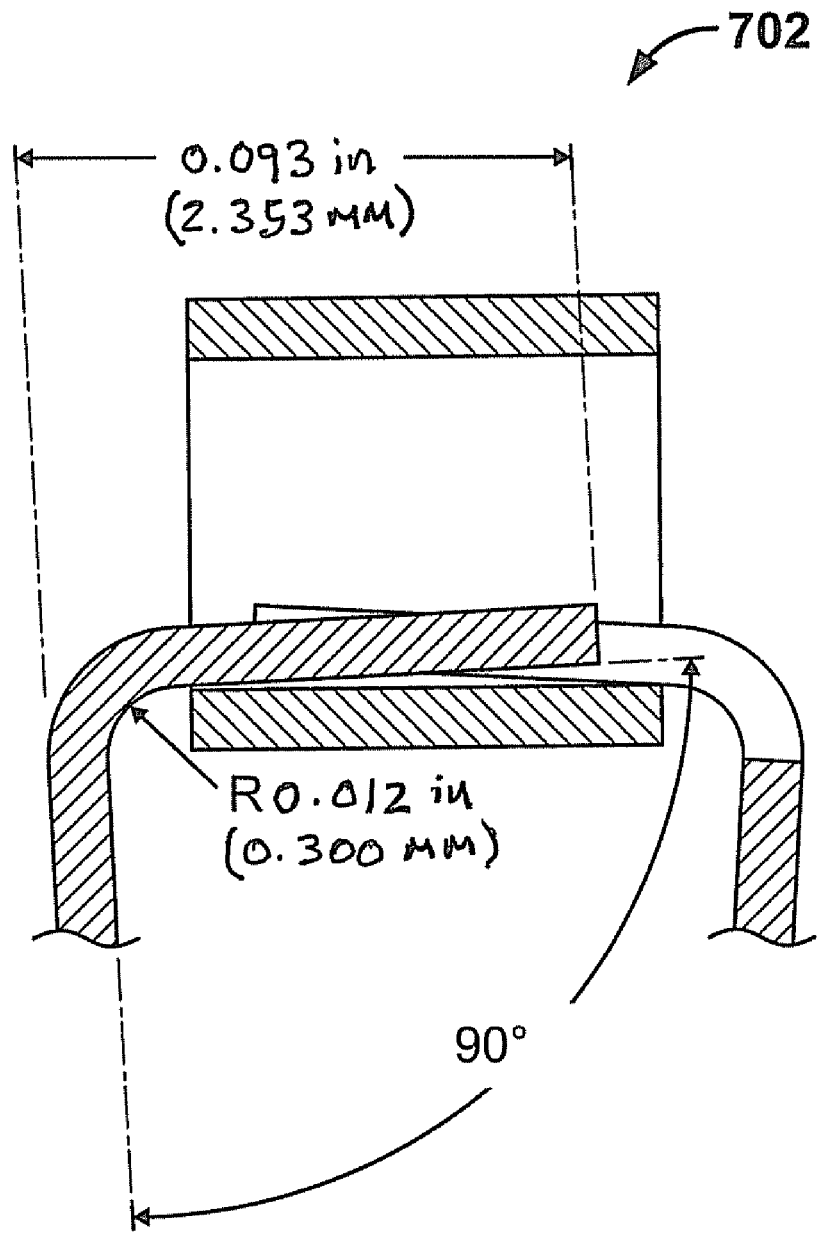
Figure 29:
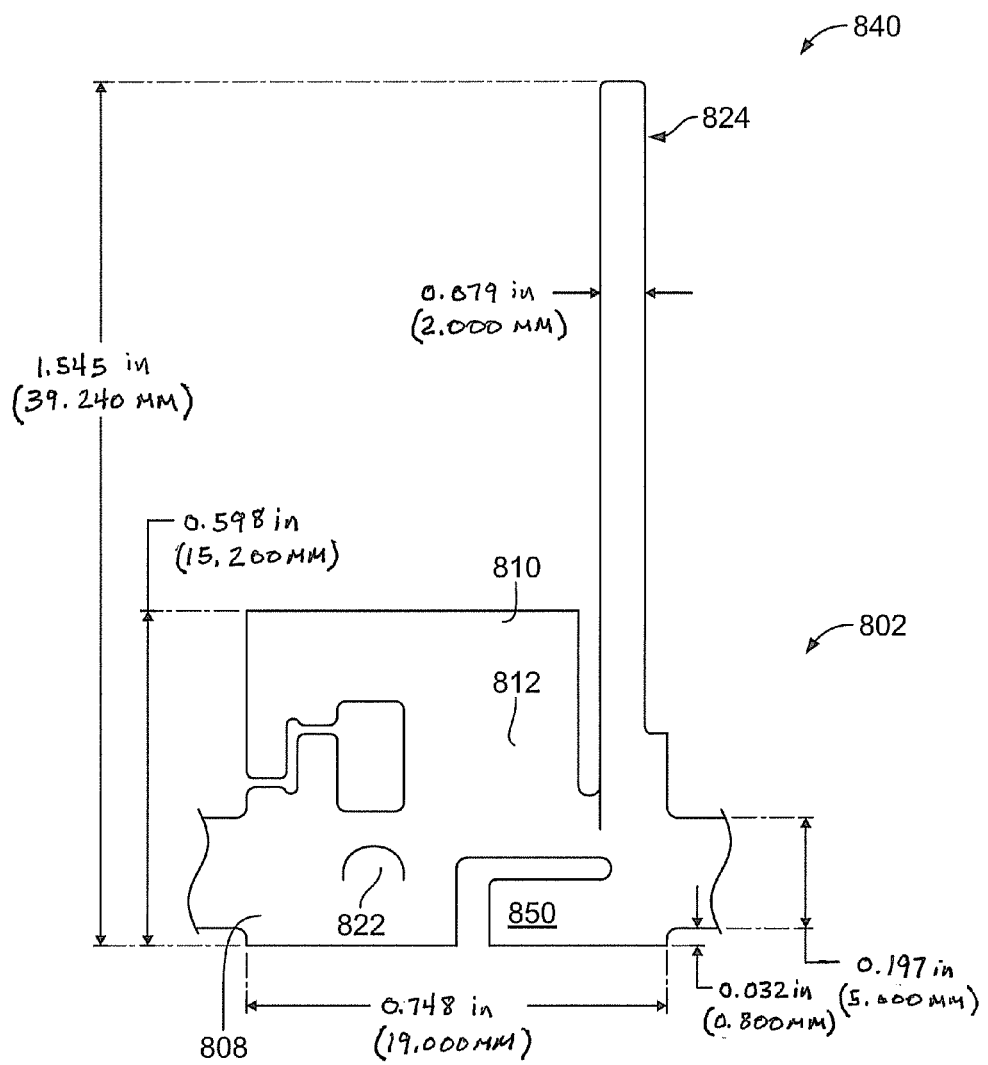

FIG. 28 is a section view of the grounding member of FIG. 27 taken in a plane including line 28-28 in FIG. 27; and FIG. 29 is a plan view of part of a piece of material having a generally flat pattern that can be used to make a grounding strip having multiple integral grounding members, and with example dimensions in inches (with millimeters in brackets) provided for various features of the piece of material (for purposes of illustration only).

Corresponding reference numerals indicate corresponding parts throughout the several views of the drawings.

DETAILED DESCRIPTION

According to various aspects, example embodiments are disclosed of card guide clip-on grounding strips (e.g., 100 (FIG. 1), etc.), which strips include grounding members (e.g., 104 (FIG. 1), etc.) and which may be clipped or placed onto edge portions of substrates for establishing electrical grounding contact from electrically-conductive portions on the substrates to card guides. The inventors hereof have recognized advantages associated with the use of their card guide clip-on grounding strips. For example, costs of assembly and installation may be reduced by installing an example embodiment of the inventors' strip of multiple grounding members as a single unit as compared to the costs associated with installing multiple single-piece, individual grounding members. Other cost advantages may also be realized with example embodiments, such as when a card guide clip-on grounding strip is formed from a single piece (e.g., a blank, etc.) of material, thus avoiding the need to weld pieces together and costs associated therewith. As such, in example embodiments of the present disclosure card guide clip-on grounding strips may have unitary, monolithic constructions.

The inventors also disclose herein example methods of forming card guide clip-on grounding strips including, for example, contact beams of grounding members of the card guide clip-on grounding strips. In example embodiments, material for forming the contact beams may be used or taken from side portions of grounding members of the card guide clip-on grounding strips (instead of from lengthwise portions of the grounding members). This, in turn, allows for closer pitch advancements such that adjacent grounding members (and grounding contact areas thereof) can be positioned closer together. And, the closer pitch advancements can help maintain, or even improve, shielding performance of the card guide clip-on grounding strips and thus avoid decreased shielding performance which could otherwise occur with larger spaces between grounding members. In some example embodiments, contact distances between adjacent grounding members may be reduced (e.g., halved, etc.) as compared to other card guide clip-on strip designs.

By way of example, there are disclosed herein example embodiments of card guide clip-on grounding strips that include multiple members with relatively small pitch advancements (e.g., about 0.4724 inches (about 12 millimeters), etc.) between adjacent ones of the members. In some example embodiments of the card guide clip-on grounding strips, one or more pair of adjacent members of the strips may be configured so as to have substantially similar pitch advancements.

Example embodiments of card guide clip-on grounding strips disclosed herein may have members with corresponding (e.g., substantially similar, etc.) compression performance as compared to single-piece versions of those members.

Furthermore, example embodiments of card guide clip-on grounding strips disclosed herein may have bi-directional non-snagging features. For example, a strip according to example embodiments may be clipped onto a substrate, which may then be slid in and out of a channel, groove, slot, etc. defined by a card guide without having the strip snag during this sliding movement.

Advantageously, the inventors' have disclosed herein unique metal bending geometries that can provide contact distances similar to or even shorter than other strip designs, while maintaining suitable (or even improved) contact pressures and exhibiting anti-snag features. The inventors' strips can also provide sufficient (or even reduced) material yielding and sufficient (or even increased) fatigue life.

Other aspects provide methods relating to installation of card guide clip-on grounding strips onto edge portions of substrates having at least one electrically conductive portion thereon. In one example embodiment, a method generally includes installing (e.g., placing, clipping, etc.) a card guide clip-on grounding strip onto and along an edge portion of a substrate such that the substrate's edge portion is received within channels defined by individual members of the strip. Such installing may be accomplished manually, or via an automated operation (e.g., via a robotic automatic pick-and-place unit, etc.). This positions at least a portion of at least one of the strip's members in electrical contact with at least one electrically conductive portion on the substrate. The method may further include slidably positioning the substrate (having the card guide clip-on grounding strip thereon) along at least one card guide such that a resiliently flexible contact beam of at least one of the strip's members electrically contacts at least a portion of the card guide. At which point, the card guide clip-on grounding strip establishes electrical grounding contact from the electrically conductive portion of the substrate to the card guide.

In various embodiments, card guide clip-on grounding strips may be relatively easily installed onto substrates with relatively low compression forces. Once installed, the grounding members of the strip may provide excellent electrical grounding contact from the substrates (e.g., ground traces on printed circuit boards or electronic cards, etc.) to card guides of racks. Some example embodiments include strips having resiliently flexible contact beams configured for inhibiting snagging of the resiliently flexible contact beams within grooves of the card guides as the substrates having the card guide clip-on grounding strips thereon slide along the grooves of the card guides. To this end, some example embodiments include strips having resiliently flexible contact beams configured to have generally rounded or arcuate transverse profiles and formed from resiliently flexible materials. With this particular configuration, the resiliently flexible contact beams are able to flex or compress downwardly in response to forces applied thereto, for example, as the substrates slide along the grooves of the card guides.

In some example embodiments, one or more members of card guide clip-on grounding strips may include one or more D-shaped lances. The D-shaped lances are configured for helping the strips remain clipped onto and in place relative to mounting surfaces (e.g., mounting surfaces of substrates to which the card guide clip-on grounding strips are installed, etc.) when the D-shaped lances are engagingly received within corresponding openings defined by the mounting surfaces. In addition, or alternatively, some example embodiments may include one or more openings in one or more of the members of the card guide clip-on grounding strips. In such embodiments, these openings may be configured for helping the strip remain clipped onto and in place relative to the mounting surfaces when protruding portions of the mounting surfaces are engagingly received within the openings of the strips.

Example embodiments will now be described more fully with reference to the accompanying drawings.

FIGS. 1-8 illustrate an example embodiment of a grounding strip at reference number 100 embodying at least one or more aspects of the present disclosure. The grounding strip 100 is configured to be installed to (e.g., clipped onto, etc.) a substrate (e.g., an electronic card, a printed circuit board, etc.), for example, as part of positioning the substrate in a card guide in a computer, chassis, rack system, etc. As such, the grounding strip 100 can help establish electrical grounding contact between the substrate (e.g., ground traces on the substrate, etc.), along a length of the substrate, and the card guide as desired.

Figure 1:
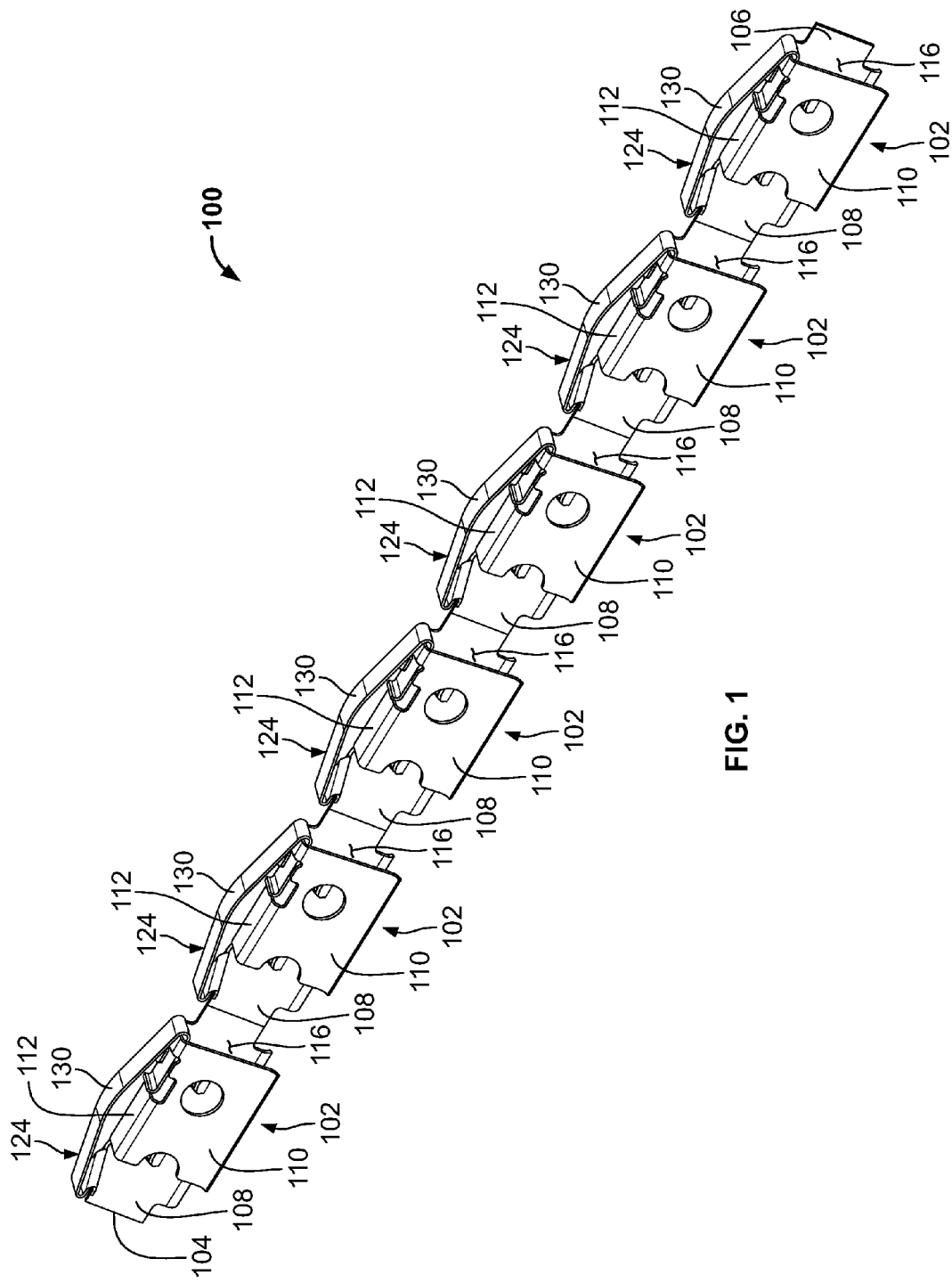
FIG. 1 is a perspective view of a grounding strip according to an example embodiment of the present disclosure and including six grounding members.
Figure 2:
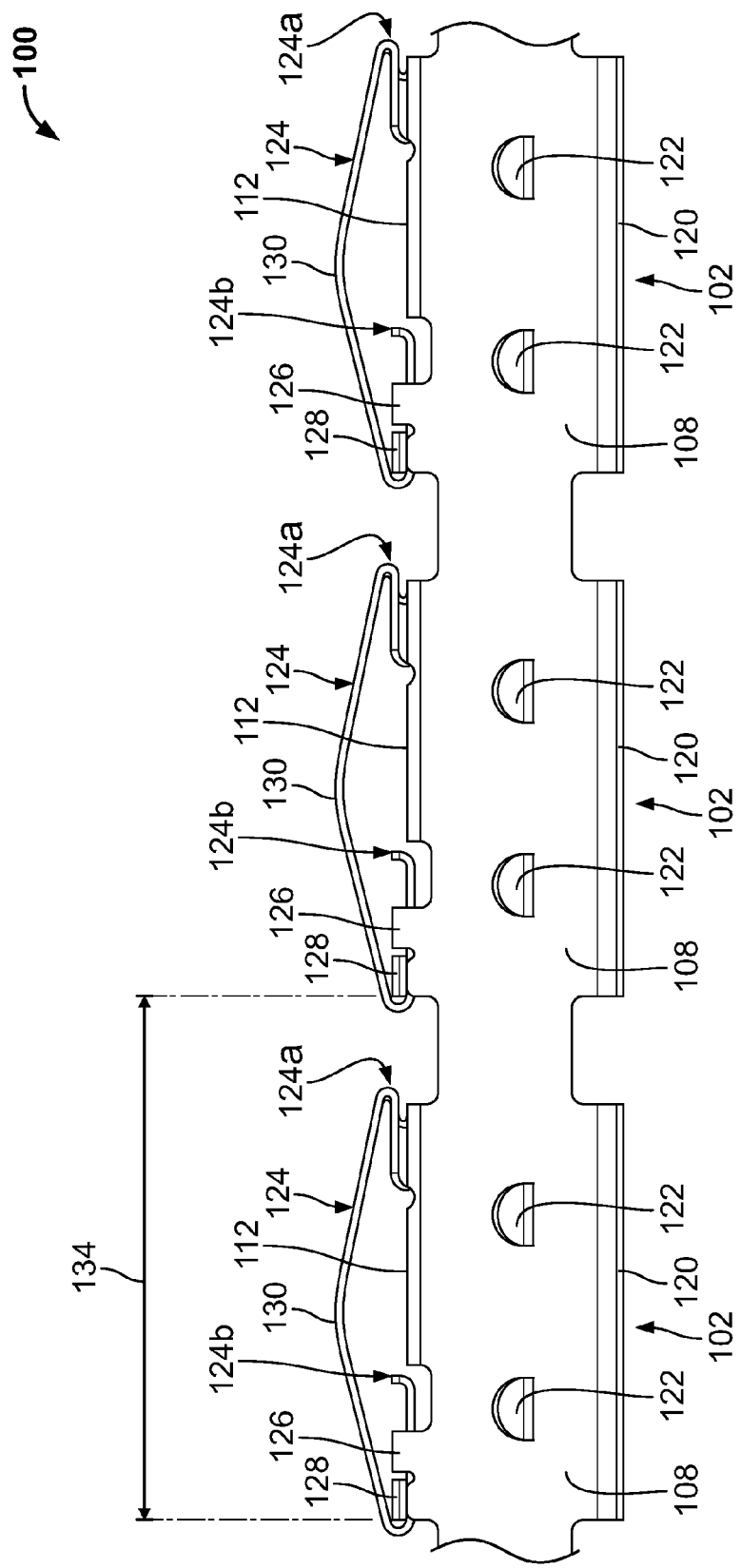
FIG. 2 is a front elevation view of the grounding strip of FIG. 1 illustrating three of the six grounding members of the grounding strip.

As shown in FIG. 1, the illustrated grounding strip 100 includes six integral (e.g., unitary, monolithic, etc.) grounding members 102 (also referred to as grounding parts, etc.). The six grounding members 102 are essentially identical, but this is not required. The grounding members 102 at the free ends of the grounding strip 100 have oppositely facing cut off tabs 104 and 106 (e.g., where the grounding strip 100 may have been separated from a larger strip, etc.). FIG. 2 illustrates a fragmentary portion of the grounding strip 100 of FIG. 1 with three of the inner grounding members 102 shown generally in profile. Alternative embodiments of grounding strips may include any suitable number of grounding members along the grounding strips (i.e., more or less than six grounding members (e.g., one, more than one, etc.)), and/or may include any suitable number of grounding members that are dissimilar from other grounding members in the grounding strips.

Figure 3:
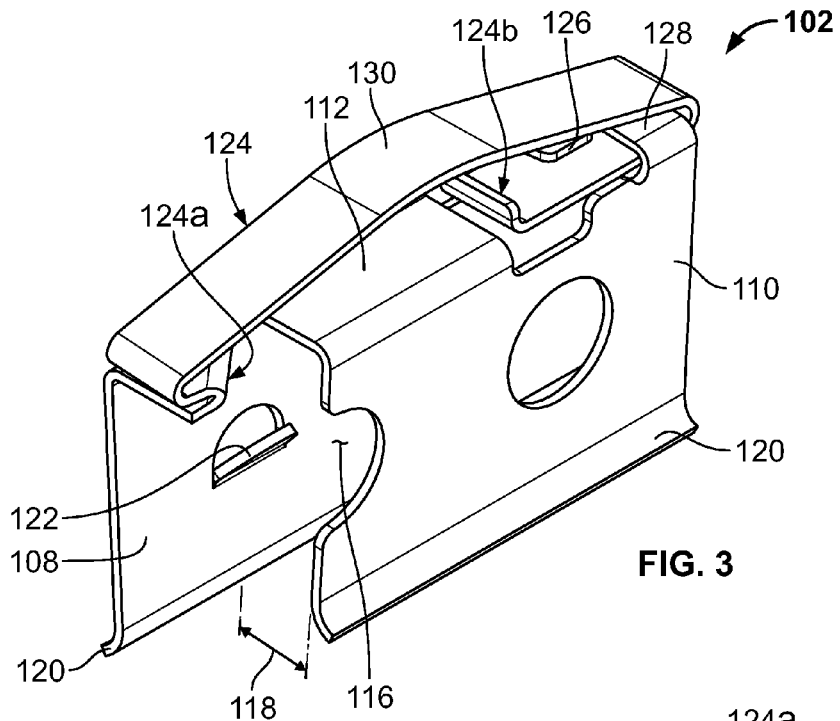
FIG. 3 is a perspective view of one of the grounding members of the grounding strip of FIG. 1.
Figure 4:
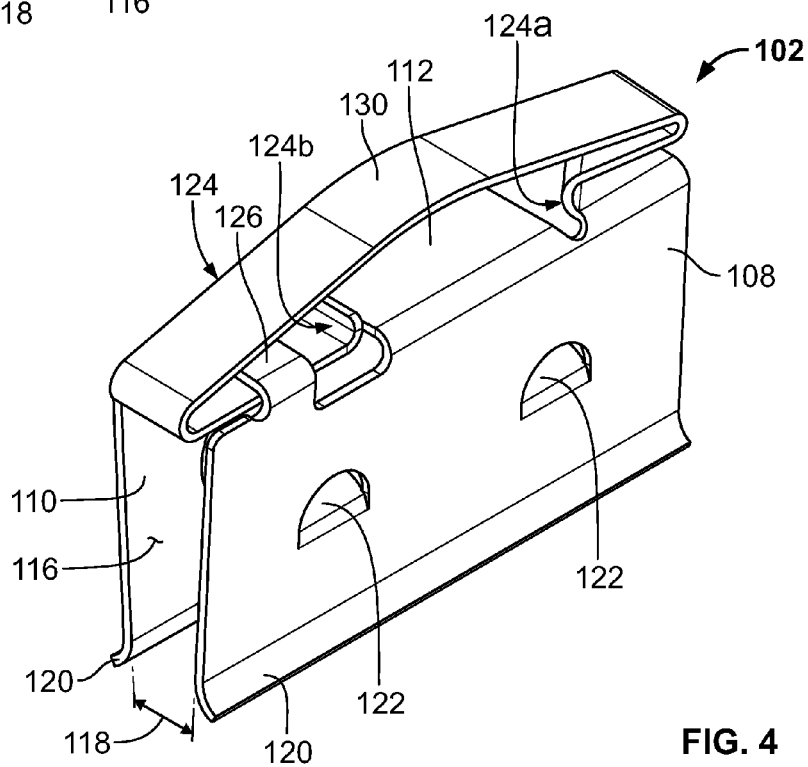
FIG. 4 is a generally opposite side perspective view of the grounding member of FIG. 3.
Figure 5:
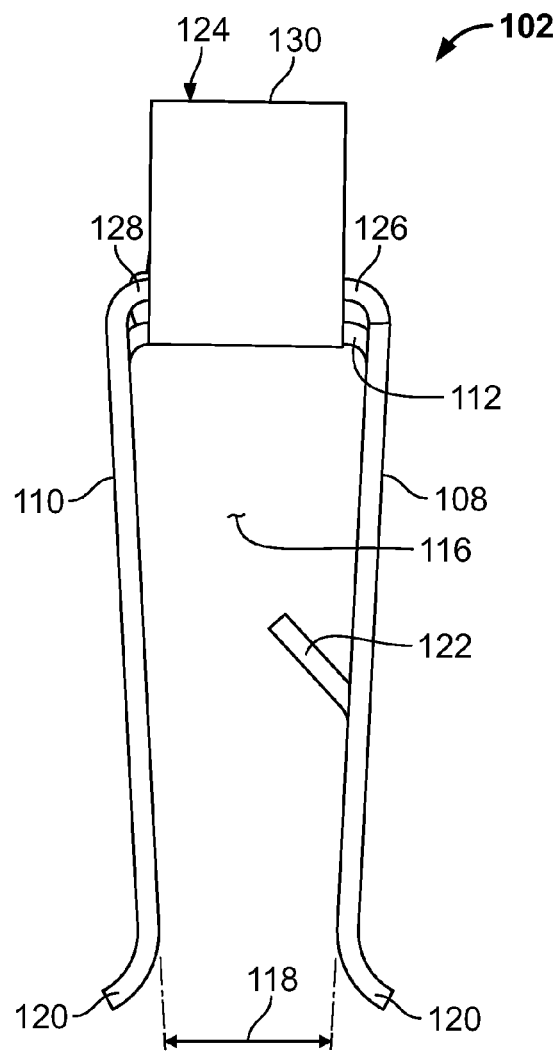
FIG. 5 is an end elevation view of the grounding member of FIG. 3.

With reference now to FIGS. 3-8, an individual one of the grounding members 102 of the grounding strip 100 will be described, with it understood that such description is also applicable to common features of each of the other grounding members 102 of the grounding strip 100. As shown in FIGS. 3-5, the illustrated grounding member 102 includes two opposing sidewall portions 108 and 110 and an upper wall portion 112. The two sidewall portions 108 and 110 extend generally downwardly (as viewed in the drawings) from the upper wall portion 112. As such, the grounding member 102 has a generally inverted U-shaped or generally C-shaped transverse profile (as defined by the wall portions 108, 110, and 112) when viewed from an end portion of the grounding member 102 (FIG. 5). With this shape, the grounding member 102 defines a channel 116 extending generally longitudinally along the grounding member 102. In particular, the channel 116 extends from one end of the grounding member 102 to the end of truncated (e.g., shortened, etc.) sidewall portion 110 (FIG. 3) Truncated sidewall portion 110 includes a length dimension that is less than a corresponding length dimension of sidewall portion 108.

The sidewall portions 108 and 110 of the illustrated grounding member 102 are integrally (e.g., unitarily, monolithically, etc.) formed with the upper wall portion 112. In particular, the sidewall portions 108 and 110 are hingedly, flexibly, etc. formed with the upper wall portion 112 such that the sidewall portions 108 and 110 may be resiliently moved outwardly away from each other, for example, when the grounding member 102, as part of the grounding strip 100, is installed to a substrate, etc. The channel 116 of the grounding member 102 is configured to allow the sidewall portions 108 and 110 to frictionally engage (e.g., squeeze, etc.) side surfaces of the substrate when an edge portion of the substrate is received within the channel 116. The resilient nature of the sidewall portions 108 and 110 (e.g., due to resilient characteristics of the material(s) from which the sidewall portions 108 and 110, and the grounding member 102, are made, etc.) tends to bias the sidewall portions 108 and 110 inwardly to create a flexible tension grip of the sidewall portions 108 and 110 onto the substrate sufficient for inhibiting removal of the grounding member 102 from the substrate (and thus the grounding strip 100 when all of the grounding members 102 are installed to the substrate) during normal use, such as when the substrate is being slid along a card guide. In addition, the sidewall portions 108 and 110 are generally straight but angled at least slightly inwardly to help frictionally receive and grip the substrate between the sidewall portions 108 and 110.

A gap 118 (e.g., a spacing, etc.) is provided between the sidewall portions 108 and 110 that is generally less than a thickness of a substrate to which the illustrated grounding member 102 (as part of the grounding strip 100) is to be installed. Thus, when the substrate is positioned between the sidewall portions 108 and 110 and into the gap 118, the sidewall portions 108 and 110 are caused to separate to allow the substrate to move into the channel 116. Cam surfaces 120 are provided along the sidewall portions 108 and 110 to help facilitate such positioning of the substrate into the gap 118 and separation of the sidewall portions 108 and 110 to accommodate the substrate. For example, when installing the grounding member 102 (as part of the grounding strip 100) to a substrate, the substrate initially contacts the cam surfaces 120 which causes the sidewall portions 108 and 110 to move generally outward and away from each other. The substrate then moves into the channel 116 of the grounding member 102 defined between the sidewall portions 108 and 110. The resilient nature of the sidewall portions 108 and 110 causes them to resist this outward movement and, in turn, press against opposing side surfaces of the substrate (to thereby help retain the grounding member 102 on the substrate).

With continued reference to FIGS. 3-5, the sidewall portion 108 of the illustrated grounding member 102 includes lances 122 configured to engage a side surface of a substrate when the grounding member 102 is installed to an edge portion of the substrate. As such, the lances 122 can help properly position the grounding member 102 on the substrate, and can further help hold the grounding member 102 (and thus the grounding strip 100 of which the grounding member 102 is a part) in place on the edge portion of the substrate. In some installations, the lances 122 may be received within (e.g., snapped into, engagingly received within, etc.) openings formed in the side surface of the substrate to help further retain the grounding member 102 on the substrate (and thus create a strong coupling with excellent electrical conductivity between the grounding member 102 and the substrate). In the illustrated embodiment, the lances 122 each have a construction defining a generally D shape. In other example embodiments, lances may have constructions defining other shapes such as, for example, T shapes, etc., or constructions defining ribs, protrusions, etc. that can operate to help hold grounding members in position on substrates.

The illustrated grounding member 102 includes a resiliently deformable contact element 124 located generally over the upper wall portion 112 (and generally over the channel 116). The contact element 124 is integrally formed with (e.g., is integrally formed from, etc.) the sidewall portion 108 of the grounding member 102. For example, as shown in FIGS. 3 and 4 a portion of the contact element 124 adjacent the sidewall portion 108 is bent, wrapped, twisted, curved, or otherwise formed in connection with the sidewall portion 108 (as generally shown at reference number 124a. As such, the contact element 124 is configured to extend over the upper wall portion 112 of the grounding member 102. And with additional reference to FIGS. 6-8, a free end portion 124b of the contact element 124 is positioned (e.g., located, engaged, locked, slidably positioned, etc.) generally underneath tabs 126 and 128 of respective sidewall portions 108 and 110 of the grounding member 102. This construction helps secure the contact element 124 in position over the upper wall portion 112 and helps accommodate flexing movement of the contact element 124 (e.g., from an unloaded position as shown in FIGS. 3 and 4 to a loaded (e.g., flexed, etc.) position when a transverse force is applied to the contact element 124, etc.) when used in connection with positioning a substrate into a card guide (e.g., the free end portion 124b of the contact element 124 may be allowed to slide relative to the tabs 126 and 128 when the contact element 124 flexes, etc.).

Figure 6:
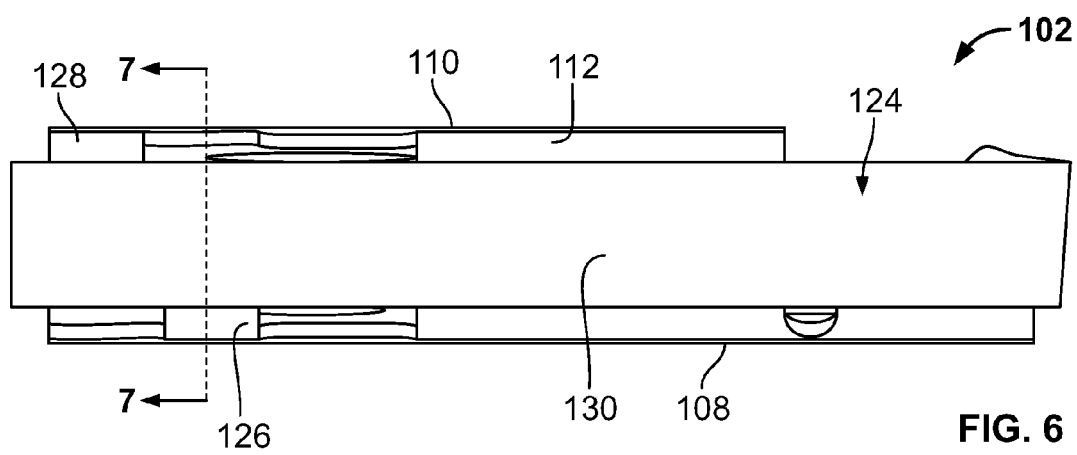
FIG. 6 is a top plan view of the grounding member of FIG. 3.
Figure 7:
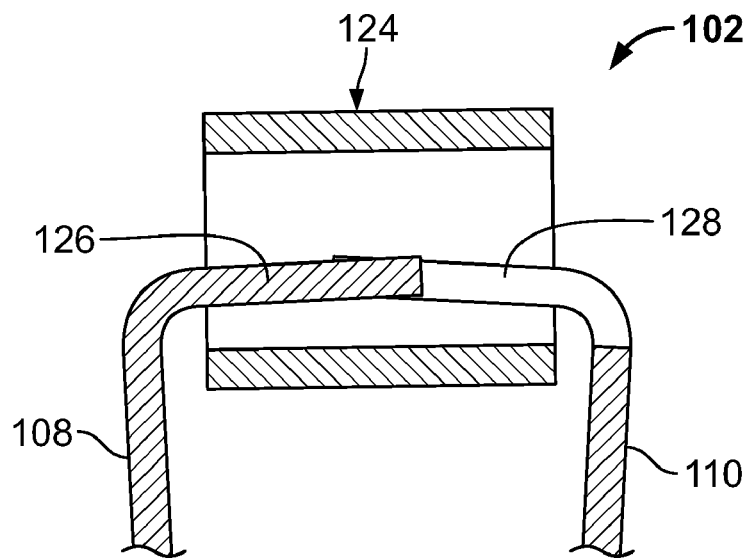
FIG. 7 is a section view of the grounding member of FIG. 6 taken in a plane including line 7-7 in FIG. 6.
Figure 8:
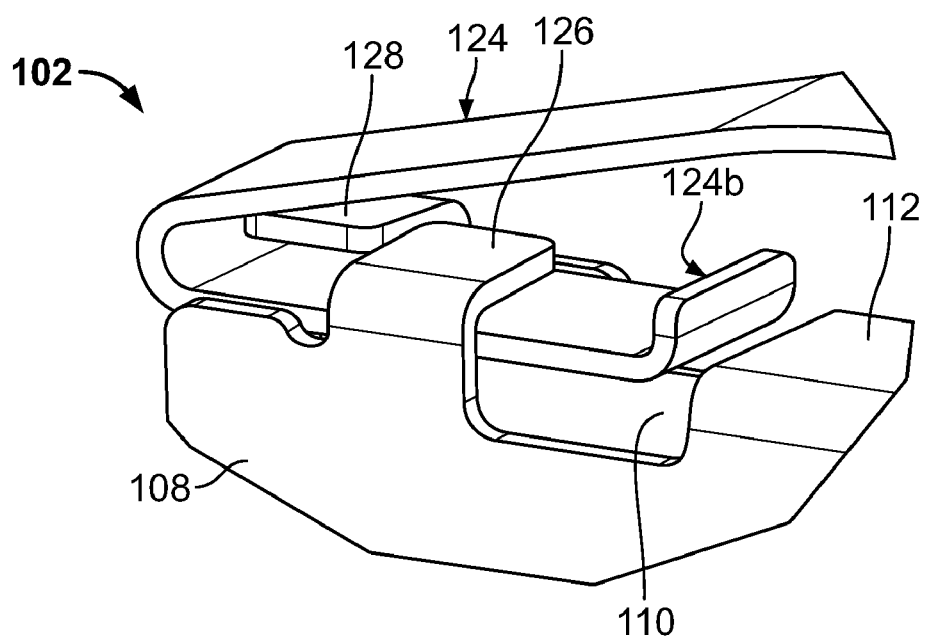
FIG. 8 is a fragmentary perspective view of the grounding member of FIG. 3.
Figure 9:
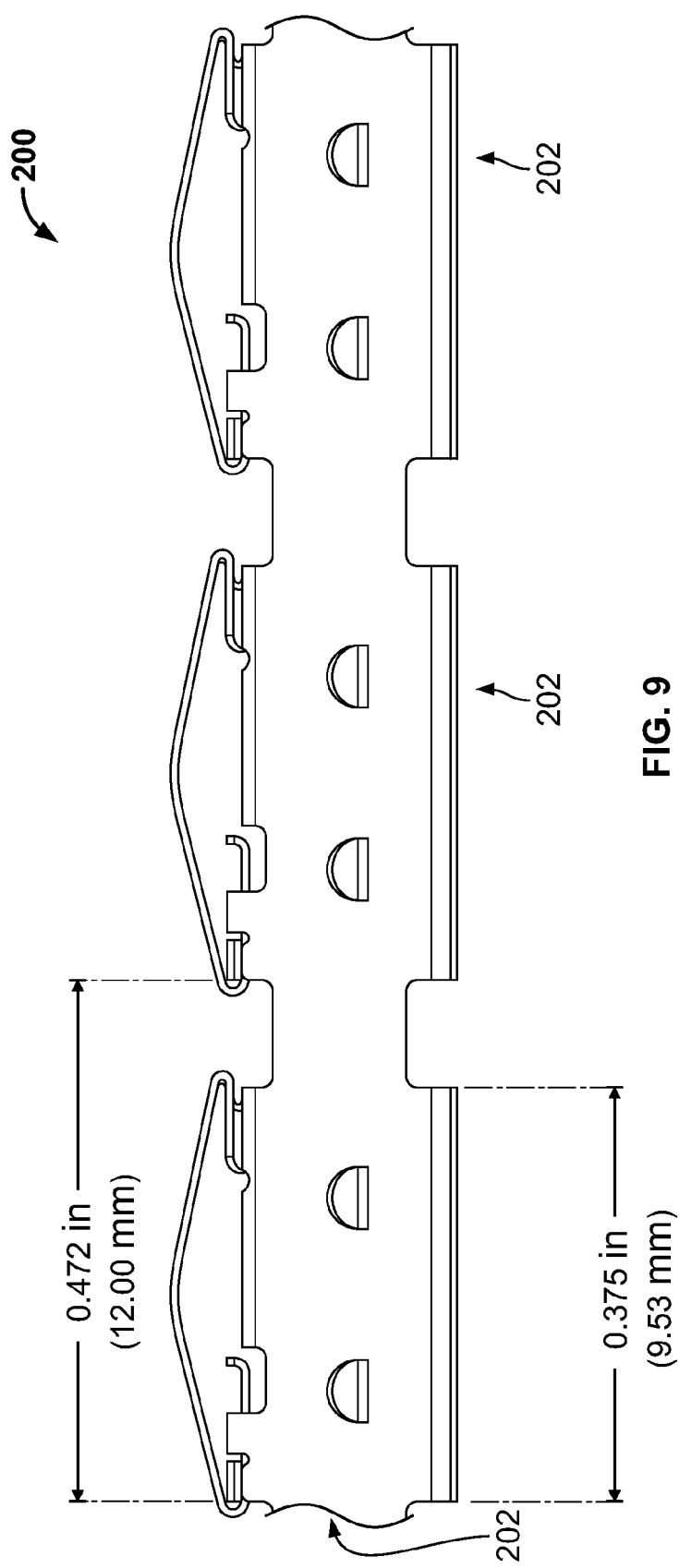
FIG. 9 is a front elevation view of a grounding strip according to another example embodiment of the present disclosure, and including three grounding members and providing example dimensions in inches (with millimeters in brackets) and degrees for various features of the grounding strip (for purposes of illustration only)
Figure 10:
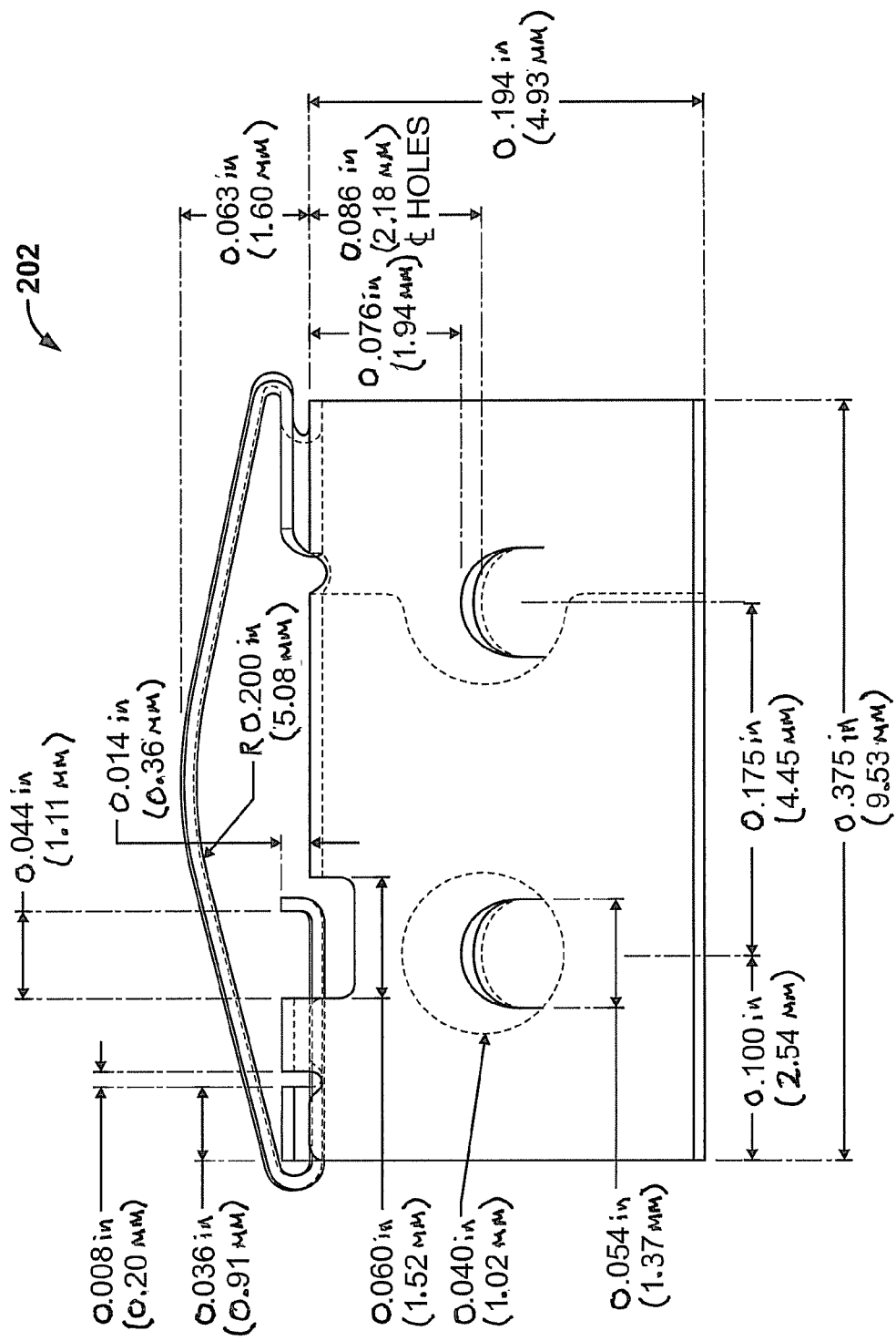
FIG. 10 is a front elevation view of one of the grounding members of the grounding strip of FIG. 9.
Figure 11:
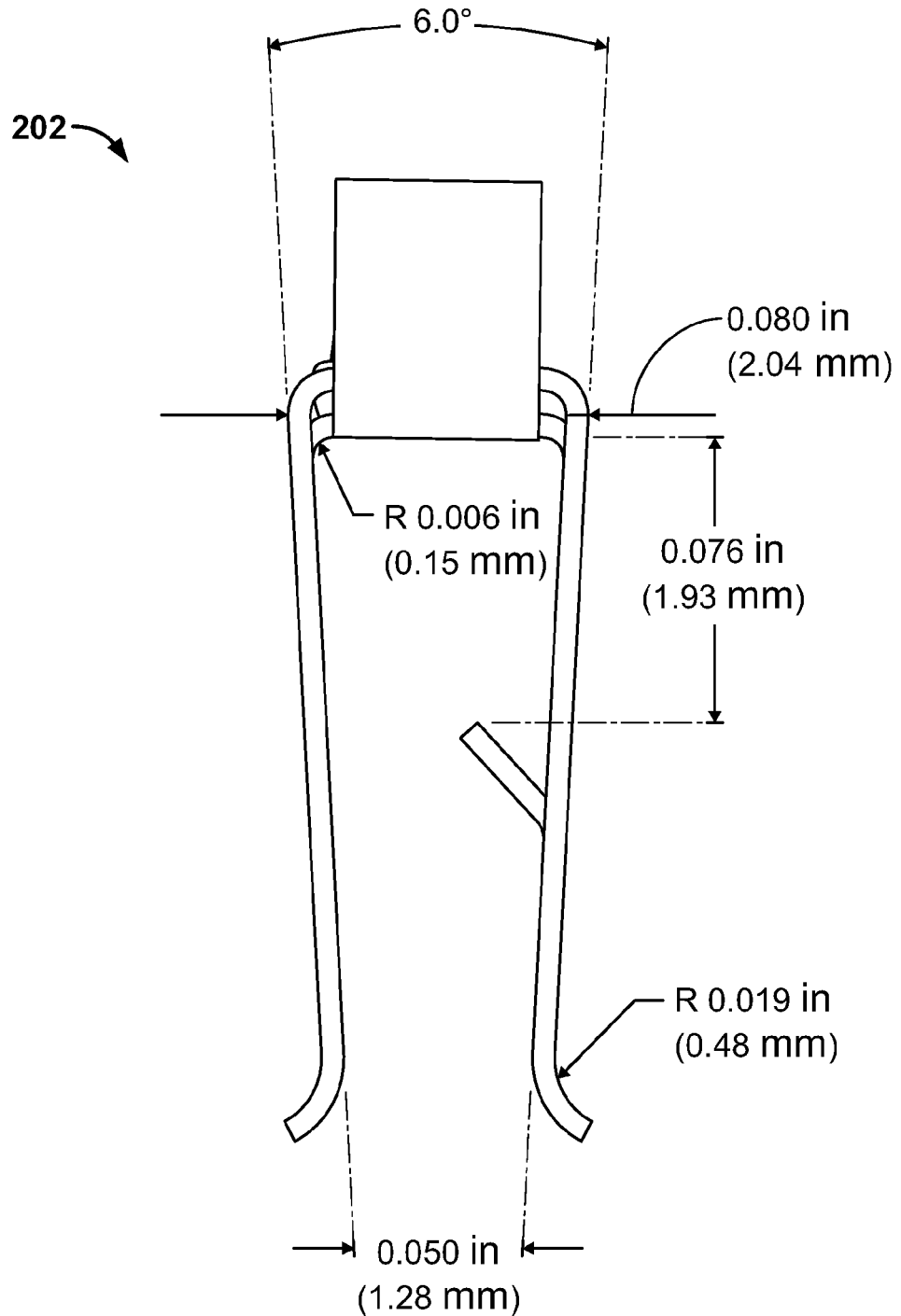
FIG. 11 is an end elevation view of the grounding member of FIG. 10.

The illustrated contact element 124 defines a generally arcuate (e.g., generally rounded, etc.) shape (FIG. 2) and includes a contact portion 130 located generally within a footprint defined by the grounding member 102 (as viewed in FIG. 6). The arcutate shape of the contact element 124 helps inhibit snagging of the contact element 124 with, for example, a card guide when the grounding member 102 and a substrate (to which the grounding member 102 (as part of the grounding strip 100) is installed) are slidably positioned within the card guide (e.g., slid along a groove within the card guide, etc.). The contact portion 130 of the contact element 124 is configured to electrically contact, for example, a portion of a card guide when a substrate (to which the grounding member 102 (as part of the grounding strip 100) is installed) is slidably positioned within the card guide. In such uses, the contact portion 130 (via the contact element 124 and the grounding member 102) allows for establishing electrical grounding contact between the substrate and the card guide. For example, the contact portion 130 can be borne against by a portion of the card guide causing the contact element 124 to flex generally towards the upper wall portion 112 (and the channel 116) of the grounding member 102. This flexing movement of the contact element 124 provides room for the grounding member 102 to fit within a desired location in the card guide (together with the substrate). The resilient nature of the material out of which the contact element 124 (and grounding member 102) is formed tends to resist this flexing movement thereby helping maintain electrical contact between the contact element 124 and a portion of the card guide.

With reference again to FIG. 1, the channels 116 of each of the grounding members 102 of the grounding strip 100 are generally aligned to allow the entire grounding strip 100 to be installed to an edge portion of a substrate. The sidewall portions 108 and 110 of the grounding members 102 cooperate to generate a clamping force on the substrate to thereby mechanically retain (e.g., frictionally retain, mechanically retain via operation of the lances 122, combinations thereof, etc.) the grounding strip 100 on the substrate. And, one or more of the lances 122 of the sidewall portions 108 and 110 of the grounding members 102 may additionally help retain and/or position the grounding strip 100 on the substrate. In addition, one or more of the individual grounding members 102 (via one or more of the sidewall portions 108 and 110 thereof) of the grounding strip 100 can make electrical contact with an electrically-conductive portion (e.g., a ground trace, etc.) of the substrate. As such, and in combination with the clamping force exerted by the installed grounding members 102 (particularly at such electrically-conductive portion of the substrate), the grounding strip 100 can create sufficient contact pressure with the substrate to establish good electrical conductivity therebetween.

After the grounding strip 100 is installed to the substrate, the grounding strip 100 and substrate can then be inserted into a card guide (e.g., in a computer, chassis, rack system, etc.) as desired. The arcutate shapes of the various contact elements 124 help inhibit snagging of the grounding strip 100 as it slides into the card guide. And, the resilient nature of the contact elements 124 allows them to flex generally towards the upper wall portions 112 of the grounding members 102 as needed to provide room to provide room for the grounding strip 100 (and substrate) to fit within a desired location in the card guide. The resilient nature of the contact elements 124 also causes them to generally resist this flexing movement, thereby helping provide a frictional fit of the grounding strip 100 and substrate when finally positioned in the card guide.

And once the grounding strip 100 and substrate are inserted in the card guide, the grounding strip 100 provides grounding operations by electrically contacting surfaces of the card guide that bear against the contact portions 130 defined by the contact elements 124 (e.g., with a force having a component generally perpendicular to a longitudinal axis of the grounding strip 100, etc.). In particular, the various contact portions 130 (via the contact elements 124 and the grounding members 102) allow for establishing electrical grounding contact between the substrate and the card guide. The resilient nature of the contact elements 124 also helps to hold the contact elements 124 against the card guide to maintain electrical contact between the contact elements 124 and the card guide.

With reference again to FIG. 2, a pitch advancement 134 between adjacent ones of the grounding members 102 of the illustrated grounding strip 100 is generally close as compared to other grounding strip designs (e.g., about 1 inch (about 25.4 millimeters) or closer, about 0.5 inches (about 12.7 millimeters) or closer, etc.). As such, the adjacent grounding members 102 (and their contact elements 124) can be positioned closer together. This, in turn, helps maintain, or even improve, shielding performance (and grounding operation) of the grounding strip 100, for example, due to a closer spacing of grounding contact portions 130, etc.

FIGS. 9-13 illustrate a grounding strip 200 according to another example embodiment of the present disclosure. The illustrated grounding strip 200 is shown with three integral grounding members 202 each having a substantially similar construction to the grounding member 102 previously described in connection with FIGS. 3-8. In connection with this embodiment, example dimensions in inches (with millimeters in brackets) and degrees are provided for various features of the grounding strip 200 and grounding members 202 (for purposes of illustration only, and not for purposes of limitation). In the particular embodiment illustrated in FIGS. 9-13, the grounding strip 200 and grounding members 202 may have the dimensions shown therein with a tolerance of about +/−0.01 inches for dimensions shown to two decimal places, a tolerance of about +/−0.005 inches for dimensions shown to three decimal places, and angular tolerances of about +/−3 degrees.

Figure 14:
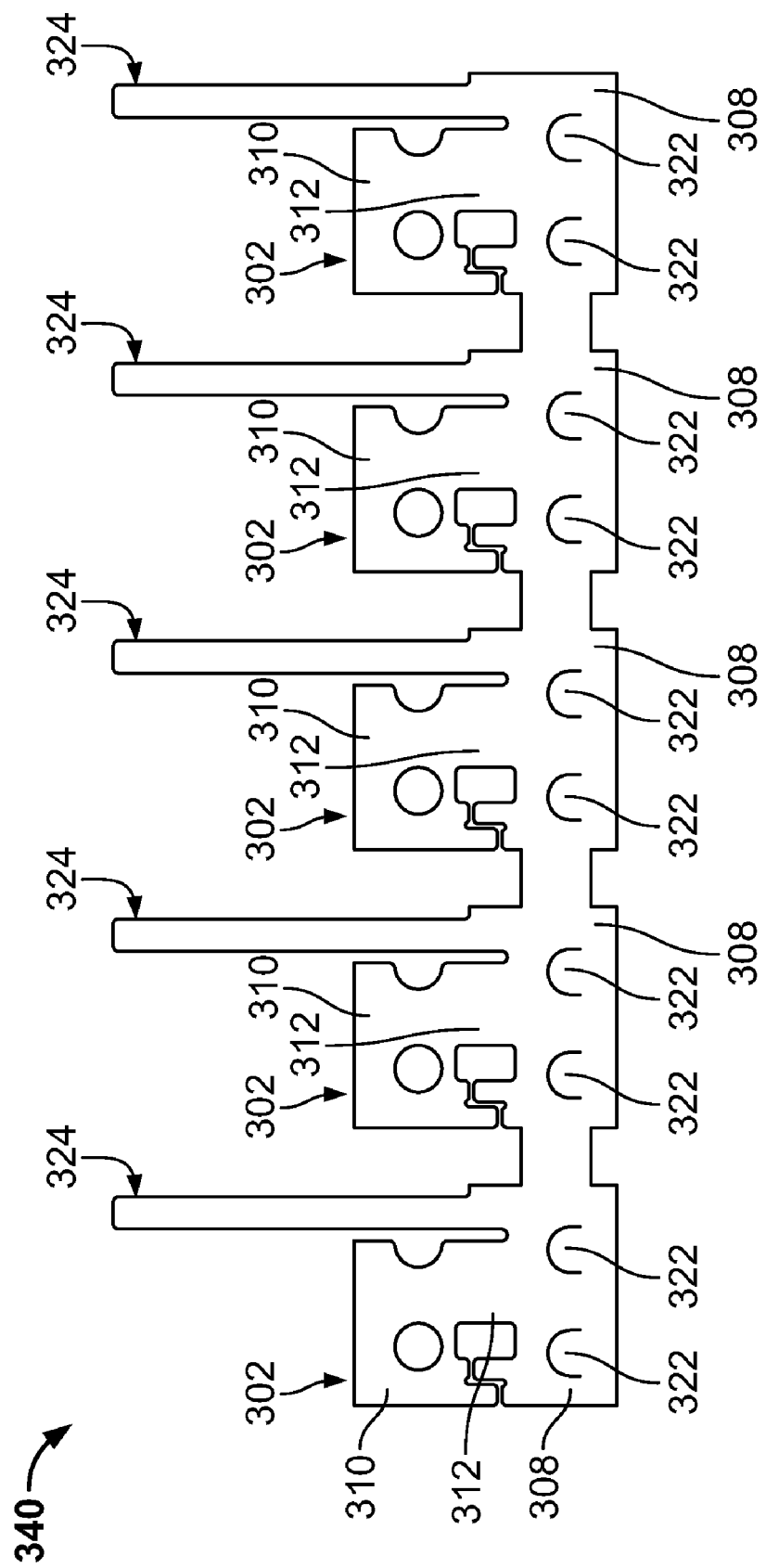
FIG. 14 is a plan view of a piece of material having a generally flat pattern that can be used to make a grounding strip having five integral grounding members.

FIG. 14 illustrates a piece (e.g., a blank, a strip, etc.) of material 340 having a flat pattern that can be used to make a grounding strip having five integral grounding members (e.g., similar to grounding strip 100 and grounding members 102 illustrated in FIG. 1, etc.). The piece of material 340 is initially formed (e.g., stamped, cut, etc.) to a desired shape for use in integrally forming the five grounding members of the grounding strip. The portions of the flat piece of material 340 ultimately used to form the grounding members are indicated at reference number 302. Features such as sidewall portions 308 and 310, an upper wall portion 312, lances 322, and a contact element 324 are also formed in the piece of material 340 for each of the grounding members to be made (e.g., while forming the piece of material 340 to the desired shape, after forming the piece of material 340 to the desired shape, etc.). After forming the piece of material 340 to the desired shape (and forming the desired features in the piece of material 340), the piece of material 340 is folded to form the grounding strip (and integral grounding members thereof). As such, it can be see that the resulting grounding strip and the grounding members thereof will have generally integral constructions, with the resulting grounding strip being a generally unitary component.

Figure 15:
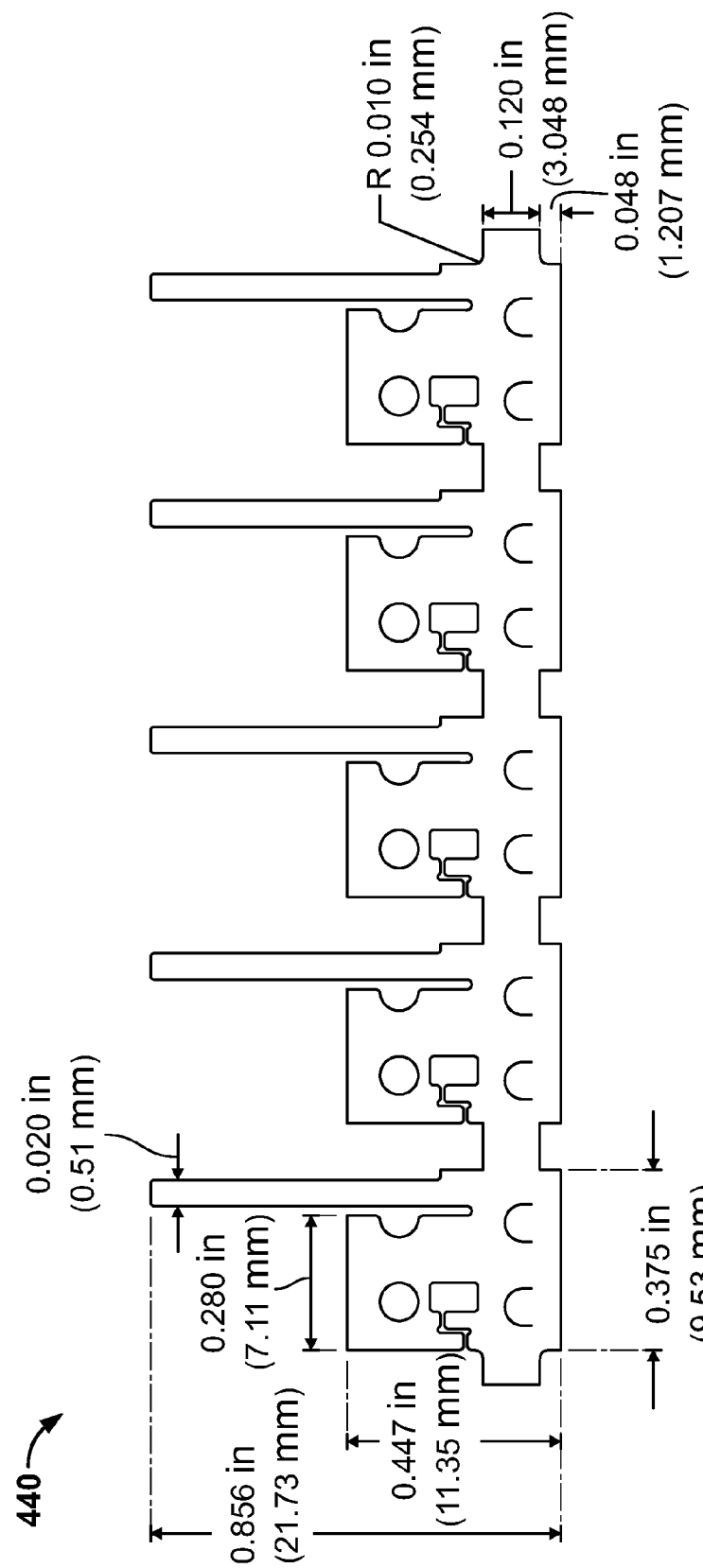
FIG. 15 is a plan view of a piece of material having a generally flat pattern that can be used to make a grounding strip having five integral grounding members, and with example dimensions in inches (with millimeters in brackets) provided for various features of the piece of material (for purposes of illustration only)

FIG. 15 illustrates another example embodiment of a piece of material 440 (e.g., a blank, etc.) having a flat pattern and that can be used to make a grounding strip having five integral grounding members. The illustrated piece of material 440 includes a substantially similar construction to the piece of material 340 previously described in connection with FIG. 14. In connection with this embodiment, example dimensions in inches (with millimeters in brackets) are provided for various features of the piece of material (for purposes of illustration only, and not for purposes of limitation). In the particular embodiment illustrated in FIG. 15, the piece of material 440 may have the dimensions shown therein with a tolerance of about +/−0.01 inches for dimensions shown to two decimal places, a tolerance of about +/−0.005 inches for dimensions shown to three decimal places, and angular tolerances of about +/−3 degrees.

Figure 16A:
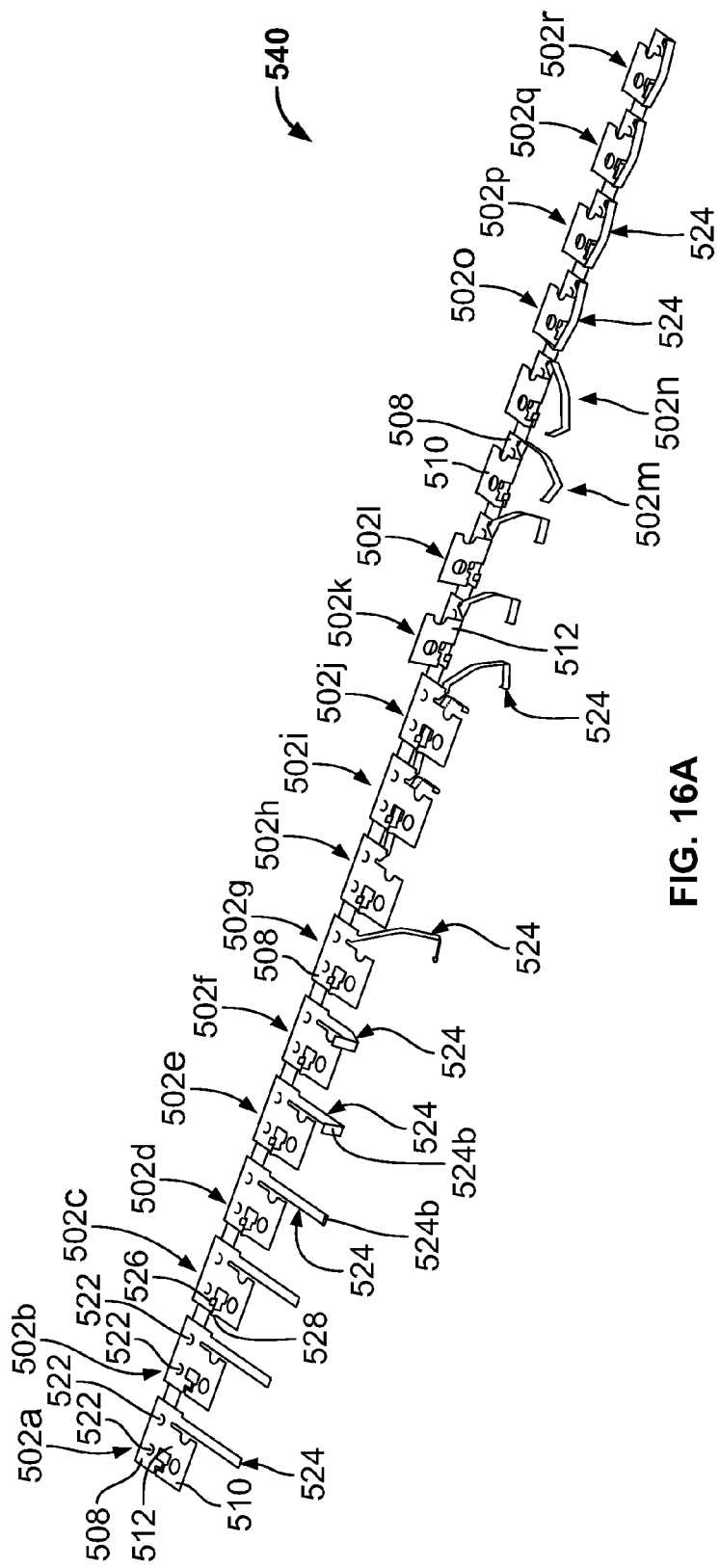
FIG. 16A is a perspective view of different stages of an example method of progressively folding a piece of material to make a grounding strip having multiple grounding members.

FIGS. 16A-C illustrate different stages of an example method of progressively folding a piece of material 540 (originally having a flat pattern similar to that of the piece of material 340 illustrated in FIG. 14) to make a grounding strip. For example, the piece of material 540 is initially formed to a desired pattern (e.g., as described in connection with the piece of material 340 shown in FIG. 14, etc.). The portions of the flat piece of material 540 ultimately used to form the grounding members are indicated at reference numbers 502a-r. And, the piece of material 540 can then fed through different stations of, for example, a progressive die where different folding operations are sequentially performed to thereby progressively form the multiple grounding members 502a-r. In this embodiment, the grounding strip will include eighteen integral grounding members 502a-r (following completion of the example method). In FIGS. 16A-C, the various grounding members 502a-r are shown following completion of folding operations at various different stations of a progressive die.

Grounding member 502a is shown with the flat initial pattern of the piece of material 540, prior to initiation of folding operations, and having features such as sidewall portions 508 and 510, an upper wall portion 512, lances 522, and a contact element 524. Next, grounding member 502b is shown with lances 522 folded generally upwardly. And, grounding member 502c is shown with tabs 526 and 528 additionally folded generally upwardly.

Grounding members 502d-j illustrate progressive folding of the contact elements 524. Grounding members 502d and 502e illustrate operations to fold a free end portion 524b of the contact element 524. And, grounding member 502f illustrates operation to fold the contact element 524 to have a generally arcuate shape. Grounding members 502g-i illustrate successive operations of folding the contact element 524 at an angle relative to sidewall portion 508 (e.g., at an angle of about 45 degrees relative to a transverse axis of grounding member, etc.) at a location adjacent the sidewall portion 508. And grounding member 502j illustrates operation of folding the contact element 524 generally downward such that the contact element 524 is oriented generally perpendicularly to the wall portion 508. As will be seen, these folding operations helps orient the contact element 524 to be ultimately positioned over upper wall portion 512.

Grounding members 502k and 502l illustrate progressive operations of folding the upper wall portion 512, and then folding the side wall portion 510 into a position generally opposite sidewall portion 508. And, grounding members 502m-p illustrate operations of folding the contact element generally over the upper wall portion 512 (thereby forming three folds adjacent sidewall portion 508), and positioning of the free end portion 524b of the contact element 524 generally under the tabs 526 and 528. Grounding members 502q and 502r are shown following completion of the folding operations.

Once formation of each of the grounding members 502a-r from the piece of material 540 is complete, the grounding strip may be used for grounding operation. Alternatively, the grounding strip may be cut to form multiple grounding strips having desired lengths. It should be appreciated that the grounding strip can have any desired length, and not limited by the grounding strips illustrated herein.

Figure 17:
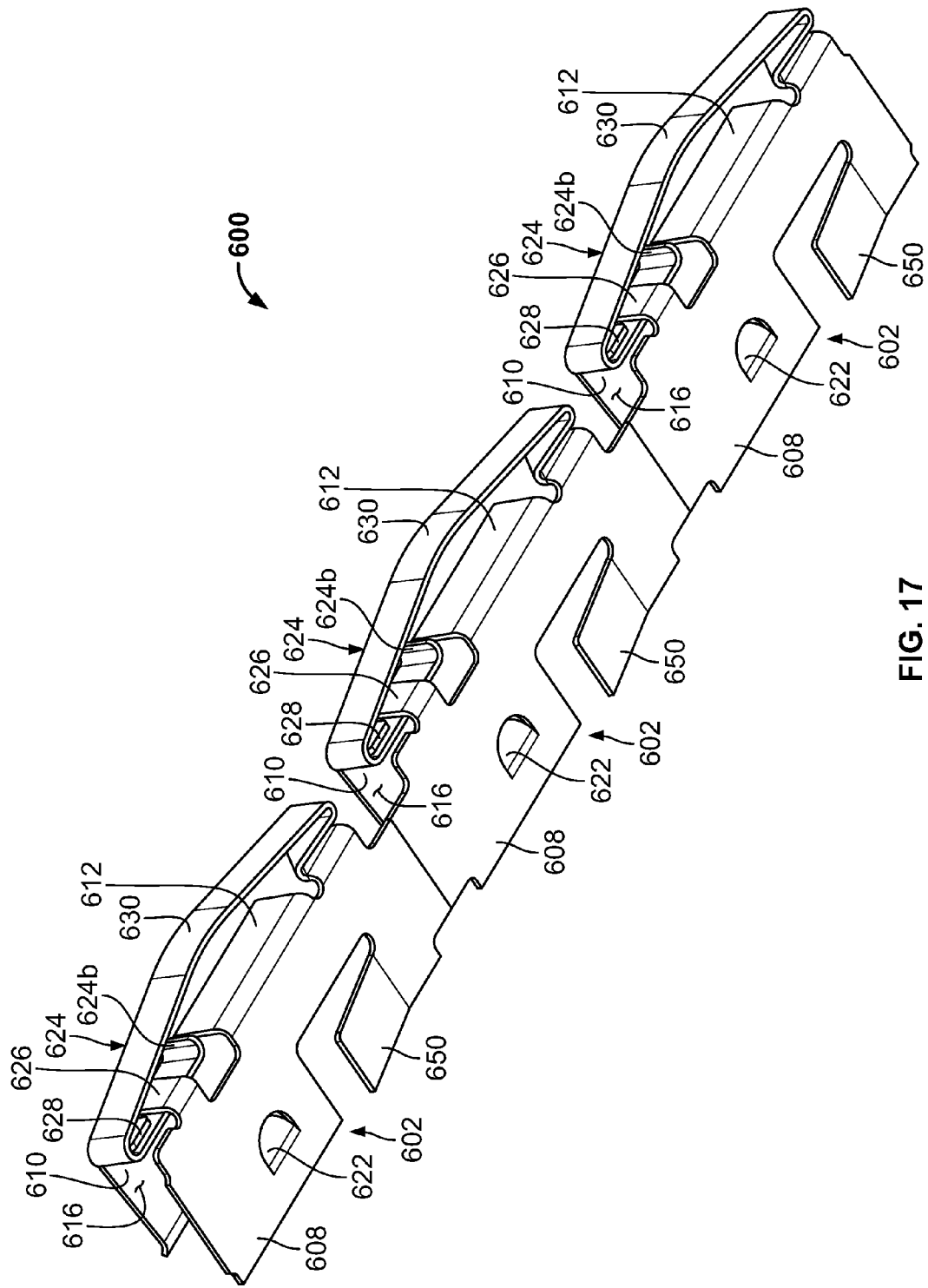
FIG. 17 is a perspective view of a grounding strip according to another example embodiment of the present disclosure and including three grounding members.
Figure 18:
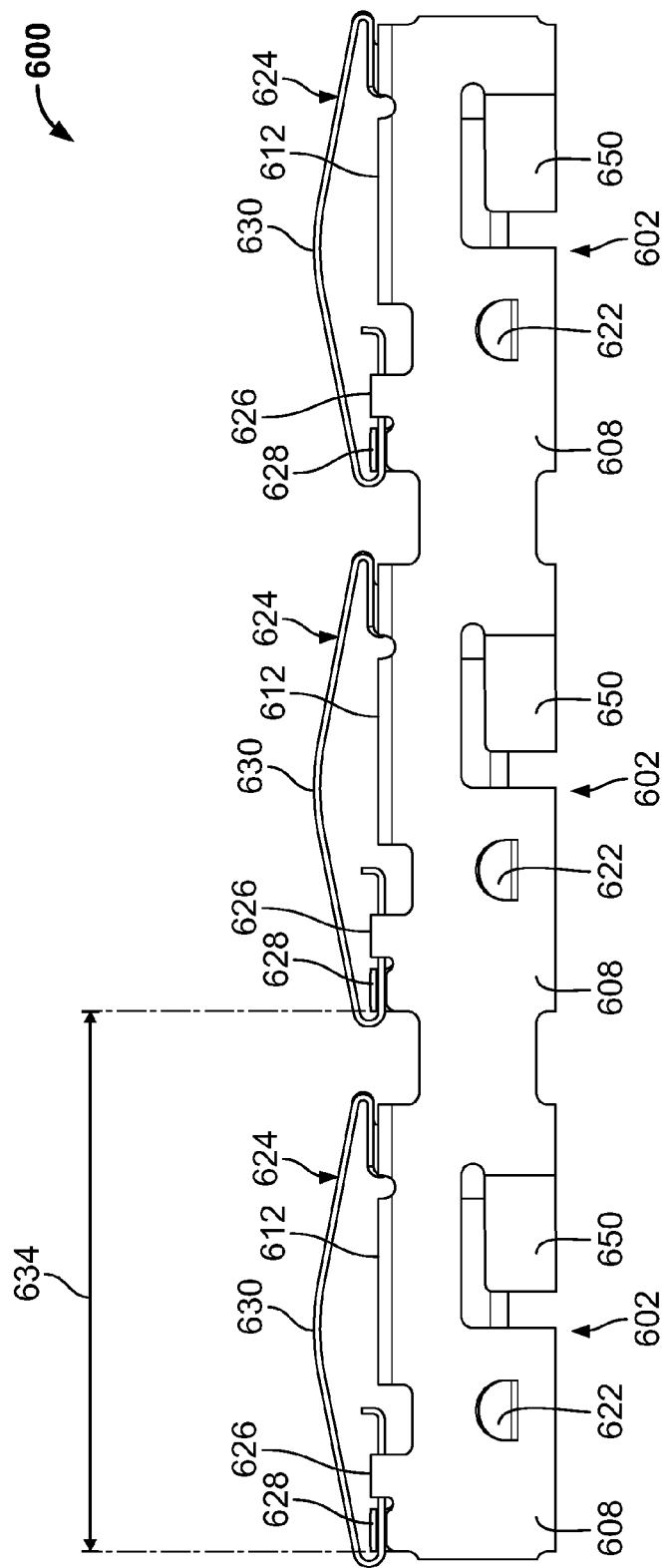
FIG. 18 is a front elevation view of the grounding strip of FIG. 17.

FIGS. 17-23 illustrate a grounding strip 600 according to another example embodiment of the present disclosure. As shown in FIGS. 17 and 18, the illustrated grounding strip 600 of this embodiment includes three integral grounding members 602.

Figure 19:
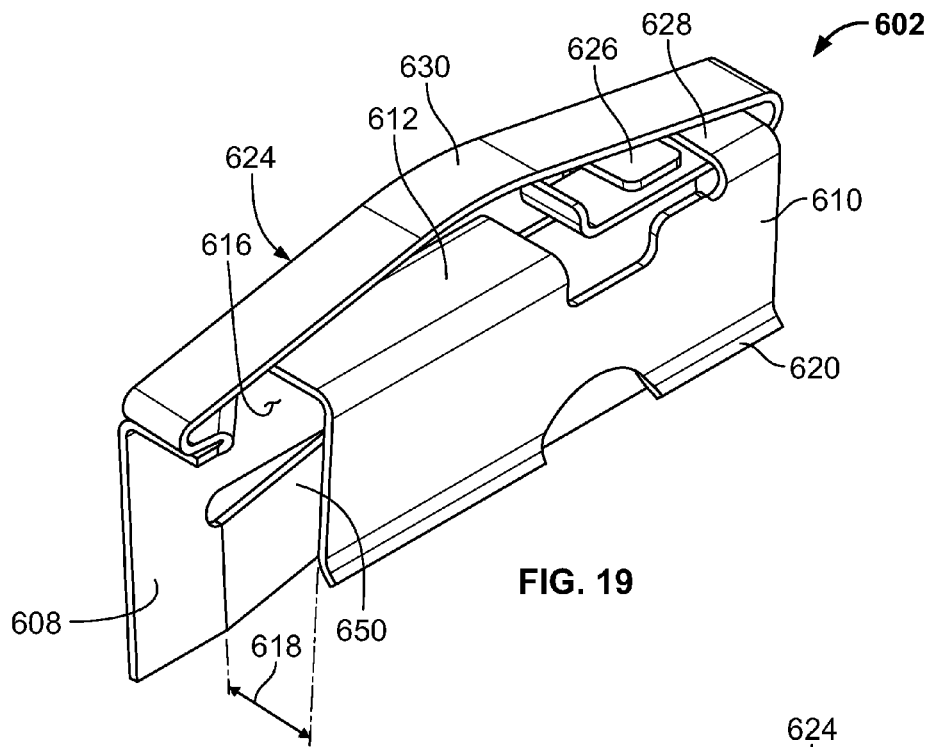
FIG. 19 is a perspective view of one of the grounding members of the grounding strip of FIG. 17.
Figure 20:
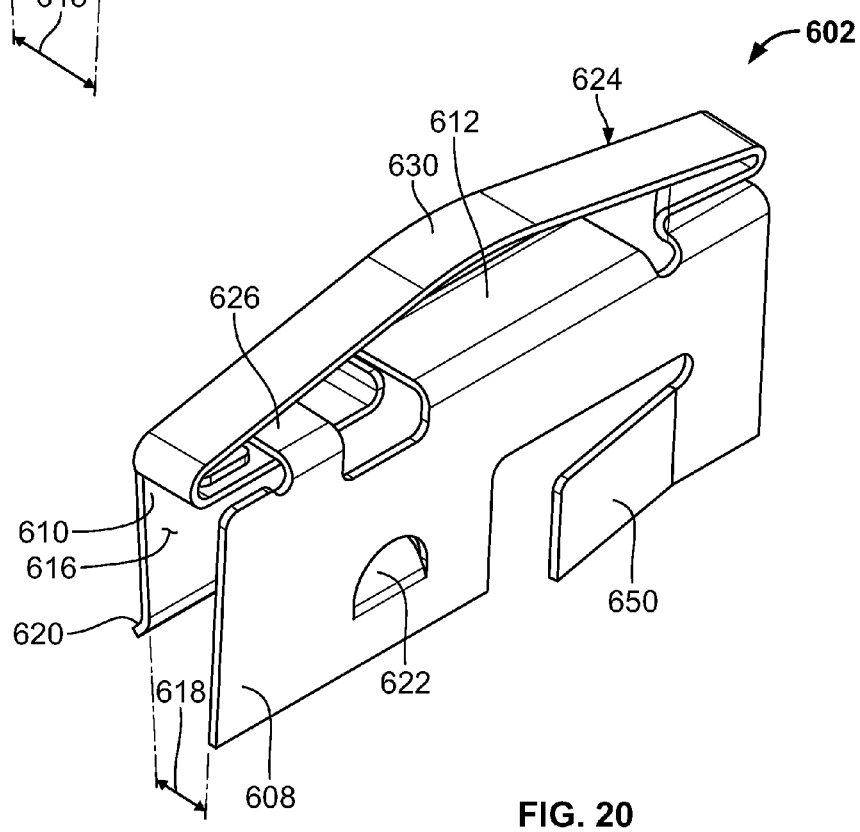
FIG. 20 is a generally opposite side perspective view of the grounding member of FIG. 19.
Figure 21:
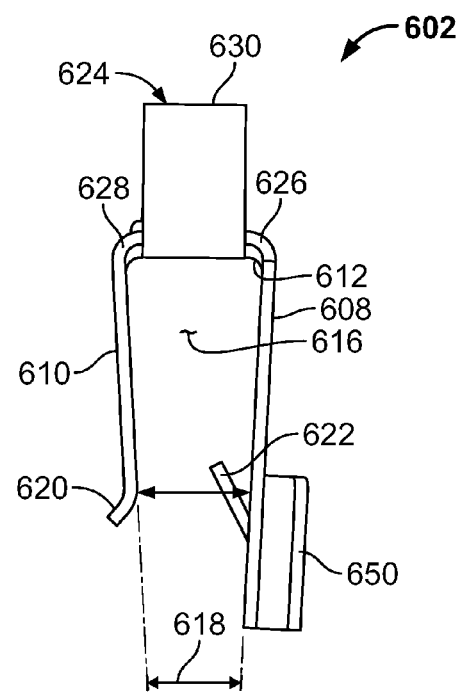
FIG. 21 is an end elevation view of the grounding member of FIG. 19.
Figure 22:
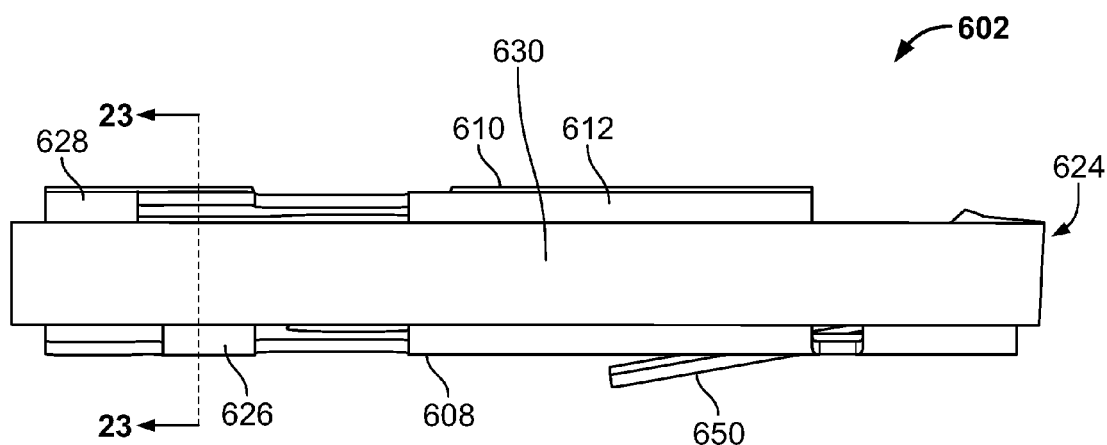
FIG. 22 is a top plan view of the grounding member of FIG. 19.
Figure 25:
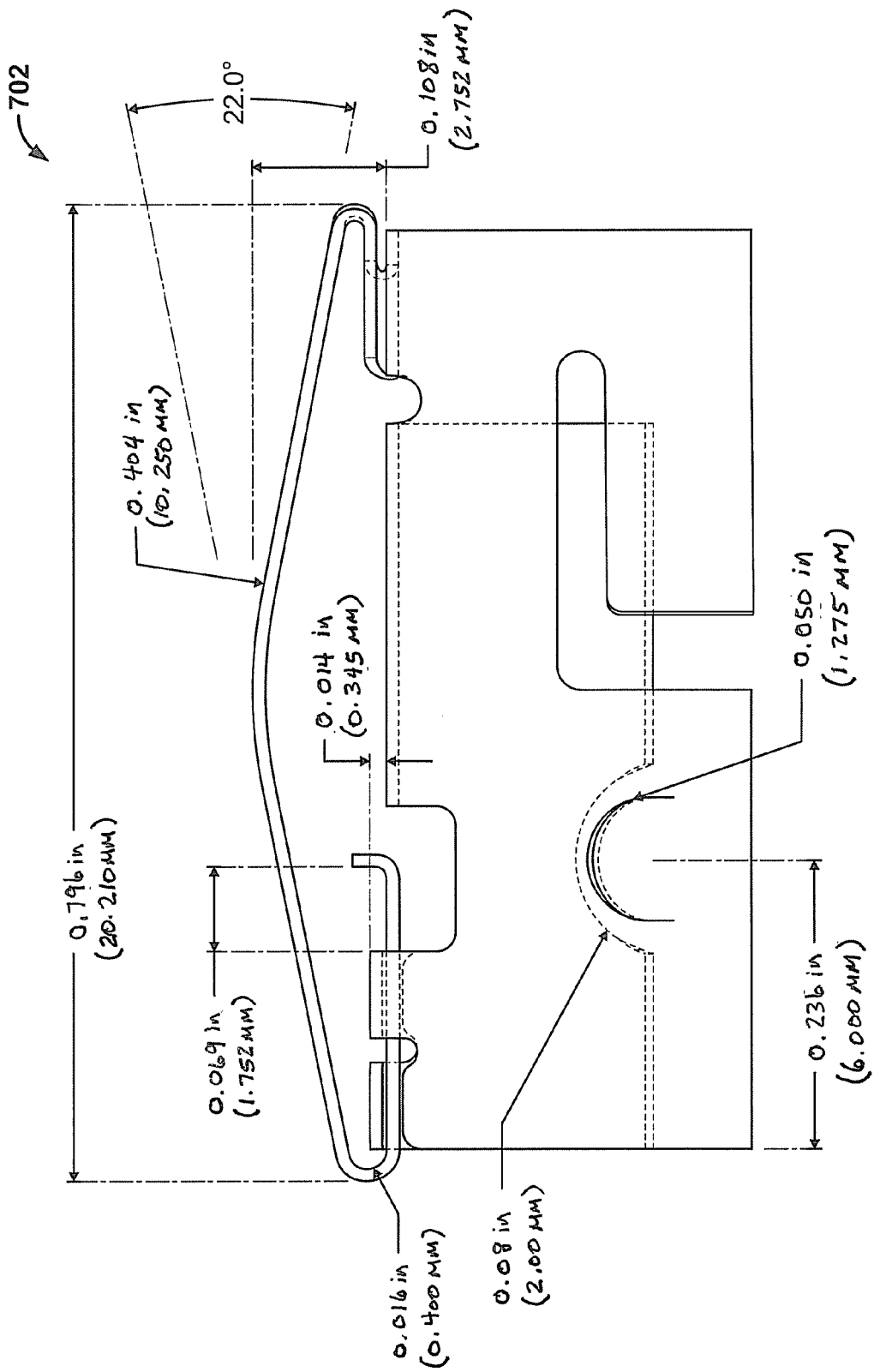
FIG. 25 is a front elevation view of one of the grounding members of the grounding strip of FIG. 24.

With reference now to FIGS. 19-23, an individual one of the grounding members 602 of the grounding strip 600 will be described, with it understood that such description is also applicable to common features of each of the other grounding members 602 of the grounding strip 600. As shown in FIGS. 19-21, the illustrated grounding member 602 includes two opposing sidewall portions 608 and 610 and an upper wall portion 612. The two sidewall portions 608 and 610 extend generally downwardly (as viewed in the drawings) from the upper wall portion 612. As such, the grounding member 602 has a generally inverted U-shaped or generally C-shaped transverse profile (as defined by the wall portions) when viewed from an end portion of the grounding member 602 (FIG. 21). With this shape, the grounding member 602 defines a channel 616 extending generally longitudinally along the grounding member 602. In particular, the channel 616 extends from one end of the grounding member 602 to the end of truncated (e.g., shortened, etc.) sidewall portion 610 (FIG. 19).

The sidewall portions 608 and 610 of the illustrated grounding member 602 are integrally (e.g., unitarily, monolithically, etc.) formed with the upper wall portion 612. In particular, the sidewall portions 608 and 610 are hingedly, flexibly, etc. formed with the upper wall portion 612 such that the sidewall portions 608 and 610 may be resiliently moved outwardly away from each other, for example, when the grounding member 602, as part of the grounding strip 600, is installed to a substrate, etc. The channel 616 of the grounding member 602 is configured to allow the sidewall portions 608 and 610 to frictionally engage (e.g., squeeze, etc.) side surfaces of the substrate when an edge portion of the substrate is received within the channel 616. The resilient nature of the sidewall portions 608 and 610 (e.g., due to resilient characteristics of the material(s) from which the sidewall portions 608 and 610, and the grounding member 602, are made, etc.) tends to bias the sidewall portions 608 and 610 inwardly to create a flexible tension grip of the sidewall portions 608 and 610 onto the substrate sufficient for inhibiting removal of the grounding member 602 from the substrate (and thus the grounding strip 600 when all of the grounding members 602 are installed to the substrate) during normal use, such as when the substrate is being slid along a card guide. In addition, the sidewall portions 608 and 610 are generally straight but angled at least slightly inwardly to help frictionally receive and grip the substrate between the sidewall portions 608 and 610.

A gap 618 (e.g., a spacing, etc.) is provided between the sidewall portions 608 and 610 that is generally less than a thickness of a substrate to which the illustrated grounding member 602 (as part of the grounding strip 600) is to be installed. Thus, when the substrate is positioned between the sidewall portions 608 and 610 and into the gap 618, the sidewall portions 608 and 610 are caused to separate to allow the substrate to move into the channel 616. A cam surface 620 is provided along the sidewall portion 610 to help facilitate such positioning of the substrate into the gap 618 and separation of the sidewall portions 608 and 610 to accommodate the substrate. For example, when installing the grounding member 602 (as part of the grounding strip 600) to a substrate, the substrate initially contacts the cam surface 620 which causes the sidewall portion 610 to move generally outward and away from sidewall portion 608. The substrate then moves into the channel 616 of the grounding member 602 defined between the sidewall portions 608 and 610. The resilient nature of the sidewall portions 608 and 610 causes them to resist this outward movement and, in turn, press against opposing side surfaces of the substrate to help frictionally retain the grounding member 602 on the substrate.

With continued reference to FIGS. 19-21, the sidewall portion 608 of the illustrated grounding member 602 includes a lance 622 configured to engage a side surface of a substrate when the grounding member 602 is installed to an edge portion of the substrate. As such, the lance 622 can further help position and/or hold the grounding member 602 (and thus the grounding strip 600 of which the grounding member 602 is a part) in place on the edge portion of the substrate. In some installations, the lance 622 may be received within (e.g., snapped into, engagingly received within, etc.) an opening formed in the side surface of the substrate to help further retain the grounding member 602 on the substrate (and thus create a strong coupling with excellent electrical conductivity between the grounding member 602 and the substrate). In the illustrated embodiment, the lance 622 has a construction defining a generally D shape. In other example embodiments, lances may have constructions defining other shapes such as, for example, T shapes, etc., or constructions defining ribs, protrusions, etc. that can operate to help hold grounding members 602 in position on substrates.

The illustrated grounding member 602 includes a contact element 624 located generally over the upper wall portion 612. The contact element 624 is integrally formed with (e.g., is integrally formed from, etc.) the sidewall portion 608 of the grounding member 602. For example, as shown in FIGS. 19 and 20 a portion of the contact element 624 is bent, wrapped, twisted, curved, or otherwise formed in connection with the sidewall portion 608. As such, the contact element 624 is configured to extend over the upper wall portion 612 (and the channel 616) of the grounding member 602. And with additional reference to FIGS. 22 and 23, a free end portion 624b of the contact element 624 is positioned (e.g., located, engaged, locked, slidably positioned, etc.) generally underneath tabs 626 and 628 of respective sidewall portions 608 and 610 of the grounding member 602. This construction helps secure the contact element 624 in position over the upper wall portion 612 and helps accommodate flexing movement of the contact element 624 when used in connection with positioning a substrate into a card guide (e.g., the free end portion 624b of the contact element 624 may be allowed to slide relative to the tabs 626 and 628 when the contact element 624 flexes, etc.).

The illustrated contact element 624 defines a generally arcuate (e.g., generally rounded, etc.) (FIG. 18) shape, and includes a contact portion 630 located generally within a footprint defined by the grounding member 602 (as viewed in FIG. 22). The arcutate shape of the contact element 624 helps inhibit snagging of the contact element 624 with, for example, a card guide when the grounding member 602 and a substrate (to which the grounding member 602 (as part of the grounding strip 600) is installed) are slidably positioned within the card guide (e.g., slid along a groove within the card guide, etc.). And, the contact portion 630 of the contact element 624 is configured to electrically contact, for example, a portion of a card guide when a substrate (to which the grounding member 602 (as part of the grounding strip 600) is installed) is slidably positioned within the card guide. In such uses, the contact portion 630 (via the contact element 624 and the grounding member 602) allows for establishing electrical grounding contact between the substrate and the card guide. For example, the contact portion 630 can be borne against by a portion of the card guide causing the contact element 624 to flex generally towards the upper wall portion 612 of the grounding member 602. This flexing movement of the contact element 624 provides room for the grounding member 602 to fit within a desired location in the card guide (together with the substrate). The resilient nature of the material out of which the contact element 624 (and grounding member 602) is formed tends to resist this flexing movement thereby helping maintain electrical contact between the contact element 624 and a portion of the card guide.

The illustrated grounding member 602 also includes a wing 650 formed in sidewall portion 608 of the grounding member 602. The wing 650 extends generally outwardly from the sidewall portion 608 and is configured to electrically contact, for example, a portion of a card guide when a substrate (to which the grounding member 602 (as part of the grounding strip 600) is installed) is slidably positioned within the card guide. In such uses, the wing 650 (via the grounding member 602) allows for establishing electrical grounding contact between the substrate and the card guide. For example, the wing 650 can be borne against by a portion of the card guide causing the wing 650 to flex generally inwardly. This flexing movement provides room for the grounding member 602 to fit within a desired location in the card guide (together with the substrate). The resilient nature of the material out of which the wing 650 is formed tends to resist this flexing movement thereby helping maintain electrical contact between the grounding member 602 and the card guide.

With reference again to FIG. 17, the channels 616 of each of the grounding members 602 of the grounding strip 600 are generally aligned to allow the entire grounding strip 600 to be installed to an edge portion of a substrate. The sidewall portions 608 and 610 of the grounding members 602 cooperate to generate a clamping force on the substrate to thereby mechanically retain (e.g., frictionally retain, mechanically retain via operation of the lances 622, combinations thereof, etc.) the grounding strip 600 on the substrate. And, one or more of the lances 622 of the sidewall portions 608 and 610 of the grounding members 602 may additionally help retain the grounding strip 600 on the substrate. In addition, one or more of the individual grounding members 602 (via one or more of the sidewall portions 608 and 610 thereof) of the grounding strip 600 can make electrical contact with an electrically-conductive portion (e.g., a ground trace, etc.) of the substrate. As such, and in combination with the clamping force exerted by the installed grounding members 602 (particularly at such electrically-conductive portion of the substrate), the grounding strip 600 can create sufficient contact pressure with the substrate to establish good electrical conductivity therebetween.

Once the grounding strip 600 is installed to the substrate, the grounding strip 600 and substrate can be inserted into a card guide (e.g., in a computer, chassis, rack system, etc.) as desired. The arcutate shapes of the various contact elements 624 help inhibit snagging of the grounding strip 600 as it slides into the card guide. And, the resilient nature of the contact elements 624 allows them to flex generally towards the upper wall portions 612 of the grounding members 602 to provide room to provide room for the grounding strip 600 (and substrate) to fit within a desired location in the card guide. The resilient nature of the contact elements 624 also causes them to generally resist this flexing movement, thereby helping provide a frictional fit of the grounding strip 600 and substrate in the card guide. Similarly, the resilient nature of the wing 650 allows it to flex generally inwardly so as not to snag on the card guide.

And once the grounding strip 600 and substrate are inserted in the card guide, the grounding strip 600 functions for grounding purposes by electrically contacting surfaces of the card guide that bear against the contact portions 630 defined by the contact elements 624 (e.g., with a force having a component generally perpendicular to a longitudinal axis of the grounding strip 600, etc.) as well as against the wings 650. In particular, the various contact portions 630 (via the contact elements 624 and the grounding members 602) and wings 650 allow for establishing electrical grounding contact between the substrate and the card guide. The resilient nature of the contact elements 624 and wings 650 also helps to hold the contact elements 624 and wings 650 against the card guide to maintain electrical contact between the grounding members 602 and the card guide.

And, with reference again to FIG. 18, a pitch advancement 634 between adjacent ones of the grounding members 602 of the illustrated grounding strip 600 is generally close as compared to other grounding strip designs (e.g., about 1 inch (about 25.4 millimeters) or closer, about 0.5 inches (about 12.7 millimeters) or closer, etc.). As such, the adjacent grounding members 602 (and their contact elements 624) can be positioned closer together. This, in turn, helps maintain, or even improve, shielding performance (and grounding operation) of the grounding strip 600.

FIGS. 24-28 illustrate a grounding strip 700 according to another example embodiment of the present disclosure. The illustrated grounding strip is shown with three integral grounding members 702 each having a substantially similar construction to the grounding member 602 previously described in connection with FIGS. 18-23. In connection with this embodiment, example dimensions in inches (with millimeters in brackets) and degrees are provided for various features of the grounding strip 700 and grounding members 702 (for purposes of illustration only, and not for purposes of limitation). In the particular embodiment illustrated in FIGS. 24-28, the strip and grounding members may have the dimensions shown therein with a tolerance of about +/−0.01 inches for dimensions shown to two decimal places, a tolerance of about +/−0.005 inches for dimensions shown to three decimal places, and angular tolerances of about +/−3 degrees.

FIG. 29 illustrates a fragment of a piece (e.g., a blank, a strip, etc.) of material 840 having a flat pattern that can be used to make a grounding strip. A pattern for only one grounding member 802 is shown (e.g., similar to grounding member 602 illustrated in FIG. 18-23, etc.). But it should be understood that the pattern could include multiple grounding members within the scope of the present disclosure. The piece of material 840 is initially formed (e.g., stamped, cut, etc.) to a desired shape for use in integrally forming the grounding member 802 of the grounding strip. Features such as sidewall portions 808 and 810, an upper wall portion 812, lances 822, a contact element 824, and a wing 850 are also formed in the piece of material 840 for the grounding member 802 (e.g., while forming the piece of material 840 to the desired shape, after forming the piece of material 840 to the desired shape, etc.). After forming the piece of material 840 to the desired shape (and forming the desired features in the piece of material 840), the piece of material 840 is folded to form the grounding strip.

In connection with this embodiment, example dimensions in inches (with millimeters in brackets) are also provided for various features of the piece of material (for purposes of illustration only, and not for purposes of limitation). In the particular embodiment illustrated in FIG. 29, the piece of material may have the dimensions shown therein with a tolerance of about +/−0.01 inches for dimensions shown to two decimal places, a tolerance of about +/−0.005 inches for dimensions shown to three decimal places, and angular tolerances of about +/−3 degrees.

A wide range of materials (e.g., resiliently flexible and electrically conductive materials, etc.) may be used for making grounding strips (e.g., 100, 200, 600, 700, etc.) of the present disclosure. In various embodiments, grounding strips (and grounding members thereof) are formed from resiliently flexible material that is elastic in nature with a modulus of elasticity sufficient so that wall portions, contact members, etc. of the grounding members may be displaced (by force) from unloaded positions to loaded positions, and then returned to the unloaded positions (upon removal of the displacing force). Such deformation of the grounding strips (and the grounding members thereof) may occur without exceeding a yield point of the material and while avoiding plastic deformation of the grounding member (and components thereof). Additionally, or alternatively, the grounding strips in some embodiments are formed from an electrically-conductive material capable of conducting electricity therethrough with impedance sufficiently low enough for electromagnetic interference/radio frequency interference (EMI/RFI) shielding applications.

By way of further example, materials suitable for making grounding strips of the present disclosure can include stainless steel or beryllium copper alloy (e.g., beryllium copper alloy that has a thickness of about 0.006 inches (about 0.015 millimeters), etc.). The beryllium copper alloy may include between about 1.8% (weight) and about 2.0% (weight) beryllium, a maximum of about 0.6% (weight) of the combination of cobalt, nickel, and iron, and the balance copper, which alloy has an electrical conductivity of between about 22% and about 28% IACS (International Annealed Copper Standard). An example of a suitable alloy is available from Brush Wellman, Cleveland, Ohio, as Brush Alloy 25 (copper alloy UNS number C17200). Other suitable materials may also be used, such as phosphor bronze, copper-clad steel, brass, monel, aluminum, steel, nickel silver, other beryllium copper alloys, among others. Furthermore, the material can optionally be pre-plated or post-plated for galvanic compatibility with the surface on which it is intended to be mounted.

In one particular example embodiment, a grounding strip is formed from Brush Wellman beryllium copper Alloy 25, ¼ hard temper, and that has an initial thickness of about 0.006 inches, and which has undergone heat treating such that a diamond-pyramid hardness number (DPH) of the material is about 353 or more using a 500 gram load. Here, the beryllium copper alloy may be cleaned, and provided with a finish for galvanic compatibility (e.g., bright tin finish per MIL-T-10727 in a thickness of about 0.0002 inches).

As described herein, various embodiments of grounding strips and grounding members thereof are integrally (e.g., unitarily, monolithically, etc.) formed so as to have integral constructions. In such embodiments, the strips may comprise unitary metal strips stamped from flat strips of sheet metal, which is then bent or formed into the desired configurations for the grounding strips. And, in some of these embodiments, grounding strips may be manufactured through continuous processes involving stamping and bending of sheet metal strips.

In some example embodiments, grounding strips may have grounding members (and sidewall portions) defining channels with transverse profiles different than what is shown in the embodiments illustrated herein (e.g., transverse profiles other than generally inverted U-shaped, transverse profiles other than generally C-shaped, etc.) depending, for example, at least in part on particular substrates to which the grounding strips are to be installed, desired clamping forces, electrical contact to be produced by the grounding members of the strips, etc. In some example embodiments, grounding strips may include one or more grounding members without truncated or shorted sidewall portions such that the grounding members have continuous channels that extend entire lengths of the grounding members. In some example embodiments, grounding strips may include one or more grounding members having two or more channels separated by openings (e.g., slots, etc.) rather than having only one channel. In any of the aforementioned embodiments, the channels of the grounding members are preferably configured to engagingly receive (e.g., via snap-fit connections, etc.) edge portions of substrates for helping mechanically retain (e.g., frictionally retain, etc.) the grounding strips installed to (e.g., clipped onto, etc.) the substrates.

In some example embodiments, grounding strips may have grounding members with sidewall portions that are straight without any inward or outward slant, such that right angles may be defined generally between inner surfaces of each of the sidewall portions and inner surfaces of upper wall portions of the grounding members. In other example embodiments, grounding strips may include grounding members having sidewall portions that are angled at least slightly outwardly relative to upper wall portions such that obtuse angles may be defined generally between inner surfaces of each of the sidewall portions and inner surfaces of the upper wall portions. And in still other example embodiments, grounding strips may have grounding members with sidewall portions configured such that angles defined generally between inner surfaces of sidewall portions and inner surfaces of upper wall portions are not equal (e.g., within individual grounding members, within individual grounding strips, etc.).

In some example embodiments, grounding strips may include grounding members having contact elements with generally arcuate configurations, thus configured so as to help inhibit snagging of the contact elements when substrates and the strips installed thereto are sliding along a groove of a card guide. Alternative embodiments, however, may have contact elements with different configurations than what is illustrated herein (e.g., configurations other than arcuate configurations, etc.) depending, for example, on the particular installation intended for the grounding strips, etc.

In various embodiments of the present disclosure, grounding strips include grounding members with channels configured (e.g., sized, shaped, constructed, formed of resilient materials, etc.) to allow the grounding strip to be installed to substrates having thicknesses between about 0.055 inches (about 1.397 millimeters) and about 0.100 inches (about 2.540 millimeters). In one embodiment, a grounding strip includes grounding members with channels configured to allow the grounding strip to be installed to substrates having thicknesses between about 0.055 inches and about 0.065 inches. In anther embodiment, a grounding strip includes grounding members with channels configured to allow the grounding strip to be installed to substrates having thicknesses between about 0.075 inches to about 0.095 inches. Alternatively, in other embodiments grounding strips include grounding members with channels configured to allow the grounding strips to be installed to substrates having thicknesses less than about 0.085 inches. And in still other embodiments, grounding strips include grounding members with channels configured to allow the grounding strips to be installed to substrates having thicknesses greater than about 0.100 inches.

Example embodiments of grounding strips of the present disclosure can readily, easily, quickly, and securely be installed to (e.g., clipped onto, snapped onto, etc.) substrates. And, the installation can be accomplished with relatively low installation force. Moreover, in some embodiments the installation can be achieved without requiring the use of additional mechanical fasteners (e.g., additional mechanical fasteners added to the grounding strip, etc.). Further, the grounding strips can be removably installed to the substrates such that, following installation, the grounding strips can be readily removed if desired.

Example embodiments of grounding strips of the present disclosure also allow for establishing such good electrical conductivity along a length of a substrate, as desired. For example, multiple ones of grounding members of the grounding strips can each establish good electrical conductivity between the substrates and, for example, card guides, etc.

The dimensions provided herein are for purposes of illustration only, as the specific dimensions for a particular application may depend, for example, upon the desired length of a grounding strip, the desired length of a piece of material used to make a grounding strip, the desired number of grounding members to include in connection with the grounding strip, desired grounding contact, material properties of the strip, particular installation (e.g., thickness of the mounting surfaces, substrate edge, etc. on which the strip will be positioned, amount of curvature or bending needed for installing the grounding strip, etc.), etc. And, any one or more of the dimensions provided herein for grounding strips, etc. may be varied in order to tailor the grounding strip, etc. to a particular application.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Disclosure of values and ranges of values for specific parameters are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A grounding member configured to be installed to an edge portion of a substrate for establishing electrical grounding contact from at least one electrically-conductive portion on the substrate to a card guide, the grounding member comprising:

opposing sidewall portions defining a channel configured to receive an edge portion of a substrate therein, the sidewall portions configured to engage the substrate when the edge portion of the substrate is received in the channel to help retain the edge portion of the substrate in the channel;

a contact element disposed generally over the channel, the contact element configured to establish electrical contact with at least a portion of a card guide when the grounding member is installed to the substrate and located in the card guide;

wherein the contact element is integrally formed with at least one of the opposing sidewall portions; and wherein:
at least one of the sidewall portions includes a lance configured to help retain the grounding member on the substrate and/or properly position the grounding member on the substrate; and/or
at least one of the sidewall portions includes a tab configured to receive a free end portion of the contact element under the tab to thereby help position and retain the contact element over the channel.

2. The grounding member of claim 1, wherein the contact element defines a generally arcuate shape.

3. The grounding member of claim 1, wherein the contact member is resiliently deformable such that the contact member can flex generally toward the channel when a pressure is applied transversely to the contact member.

4. The grounding member of claim 1, wherein the opposing sidewall portions include first and second opposing sidewall portions, wherein the contact element is integrally formed with the first sidewall portion, and wherein the contact element includes at least two folds adjacent the first sidewall portion configured to position the contact element generally over the channel.

5. The grounding member of claim 4, wherein the at least two folds of the contact element include three folds.

6. The grounding member of claim 4, wherein the at least two folds include one fold oriented at an angle of about 45 degrees relative to a transverse axis of the grounding member.

7. A grounding member configured to be installed to an edge portion of a substrate for establishing electrical grounding contact from at least one electrically-conductive portion on the substrate to a card guide, the grounding member comprising:

first and second opposing sidewall portions defining a channel configured to receive an edge portion of a substrate therein, the first and second sidewall portions configured to engage the substrate when the edge portion of the substrate is received in the channel to help retain the edge portion of the substrate in the channel;

a contact element disposed generally over the channel, the contact element configured to establish electrical contact with at least a portion of a card guide when the grounding member is installed to the substrate and located in the card guide;

wherein the contact element is integrally formed with the first sidewall portion, and wherein a length dimension of the first sidewall portion is greater than a corresponding length dimension of the opposing second sidewall portion.

8. The grounding member of claim 7, wherein at least one of the sidewall portions includes a lance configured to help retain the grounding member on the substrate and/or properly position the grounding member on the substrate.

9. The grounding member of claim 7, wherein at least one of the sidewall portions includes a tab configured to receive a free end portion of the contact element under the tab to thereby help position and retain the contact element over the channel.

10. The grounding member of claim 1, comprising an integral construction wherein all features of the grounding member are integrally formed from a single piece of material.

11. A grounding strip comprising the grounding member of claim 1 in combination with at least one additional grounding member, and wherein the grounding member of claim 1 and the at least one additional grounding member are integrally formed from a single piece of material so as to have a unitary construction.

12. A grounding strip configured to be installed along an edge portion of a substrate for establishing electrical grounding contact from at least one electrically-conductive portion on the substrate to a card guide, the grounding strip comprising at least two grounding members each having an integral construction, wherein the at least two grounding members are integrally formed with each other from a single piece of material;

wherein at least one of the at least two grounding members includes opposing sidewall portions defining a channel configured to receive an edge portion of a substrate therein, the sidewall portions configured to engage the substrate when the edge portion of the substrate is received in the channel to help retain the edge portion of the substrate in the channel; and a contact element integrally formed with at least one of the opposing sidewall portions and disposed generally over the channel, the contact element configured to establish electrical contact with at least a portion of a card guide when the grounding member is installed to the substrate and located in the card guide; and wherein:
the opposing sidewall portions include first and second opposing sidewall portions, the contact element is integrally formed with the first sidewall portion, and wherein a length dimension of the first sidewall portion is greater than a corresponding length dimension of the opposing second sidewall portion; and/or
at least one of the sidewall portions includes a lance configured to help retain the at least one of the at least two grounding members on the substrate and/or properly position the at least one of the at least two grounding members on the substrate; and/or
at least one of the sidewall portions includes a tab configured to receive a free end portion of the contact element under the tab to thereby help position and retain the contact element over the channel.

13. The grounding strip of claim 12, wherein a pitch advancement between adjacent ones of the at least two grounding members is about 1 inch or less.

14. The grounding strip of claim 12, wherein a pitch advancement between adjacent ones of the at least two grounding members is about 0.5 inches or less.

15. The grounding strip of claim 12, wherein the at least two grounding members includes at least six grounding members.

16. The grounding strip of claim 12, wherein each of the at least two grounding members includes:
opposing sidewall portions defining a channel configured to receive an edge portion of a substrate therein; and
a contact element disposed generally over the channel, the contact element configured to establish electrical contact with at least a portion of a card guide when the grounding strip is installed to the substrate and located in the card guide;

wherein the contact element is integrally formed with at least one of the opposing sidewall portions.

17. The grounding strip of claim 16, wherein for each of the at least two grounding members:

the opposing sidewall portions include first and second opposing sidewall portions, the contact element is integrally formed with the first sidewall portion, and wherein a length dimension of the first sidewall portion is greater than a corresponding length dimension of the opposing second sidewall portion; and/or at least one of the sidewall portions includes a lance configured to help retain the at least one of the at least two grounding members on the substrate and/or properly position the at least one of the at least two grounding members on the substrate; and/or at least one of the sidewall portions includes a tab configured to receive a free end portion of the contact element under the tab to thereby help position and retain the contact element over the channel.

18. A method of making a grounding member configured to be installed to an edge portion of a substrate for establishing electrical grounding contact from at least one electrically-conductive portion on the substrate to a card guide, the method comprising:

forming a desired shape for the grounding member from a flat piece of material; and folding the flat piece of material so as to define opposing sidewall portions, a channel disposed generally between the opposing sidewall portions, and a contact element disposed generally over the channel for the grounding member;

wherein the contact element is integrally formed with at least one of the opposing sidewall portions; and wherein:
the opposing sidewall portions include first and second opposing sidewall portions, the contact element is integrally formed with the first sidewall portion, and wherein a length dimension of the first sidewall portion is greater than a corresponding length dimension of the opposing second sidewall portion; and/or wherein:
at least one of the sidewall portions includes a lance configured to help retain the grounding member on the substrate and/or properly position the grounding member on the substrate; and/or at least one of the sidewall portions includes a tab configured to receive a free end portion of the contact element under the tab to thereby help position and retain the contact element over the channel;

whereby the contact element is configured to establish electrical contact with at least a portion of a card guide when the grounding strip is installed to a substrate and located in the card guide.

19. The method of claim 18, wherein the grounding member is a first grounding member, the method further comprising:

forming a desired shape for at least a second grounding member from the flat piece of material; and folding the flat piece of material so as to define opposing sidewall portions, a channel disposed generally between the opposing sidewall portions, and a contact element disposed generally over the channel for the second grounding member;

wherein the contact element of the second grounding member is integrally formed with at least one of the opposing sidewall portions of the second grounding member; and wherein the first and second grounding members are integrally formed from the flat piece of material so as to have a unitary construction.

* * * * *